US008693699B2

(12) United States Patent
Fellers et al.

(10) Patent No.: US 8,693,699 B2
(45) Date of Patent: Apr. 8, 2014

(54) METHOD FOR ADAPTIVE CONTROL AND EQUALIZATION OF ELECTROACOUSTIC CHANNELS

(75) Inventors: Matthew Fellers, San Francisco, CA (US); Grant Davidson, Burlingame, CA (US); Rongshan Yu, Singapore (SG); Eric Benjamin, Pacifica, CA (US); Kenneth Gundry, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 471 days.

(21) Appl. No.: 13/056,251

(22) PCT Filed: Jul. 29, 2009

(86) PCT No.: PCT/US2009/052042

§ 371 (c)(1), (2), (4) Date: Jan. 27, 2011

(87) PCT Pub. No.: WO2010/014663

PCT Pub. Date: Feb. 4, 2010

(65) Prior Publication Data

US 2011/0142247 A1 Jun. 16, 2011

Related U.S. Application Data

(60) Provisional application No. 61/137,377, filed on Jul. 29, 2008.

(51) Int. Cl.
*H03B 29/00* (2006.01)

(52) U.S. Cl.
USPC ........................ 381/71.1; 381/71.6; 381/71.12

(58) Field of Classification Search
USPC ........................ 381/71.1; 700/94; 379/406.09
See application file for complete search history.

(56) References Cited

U.S. PATENT DOCUMENTS 4,677,676 A 6/1987 Eriksson
4,677,677 A 6/1987 Eriksson
5,416,846 A 5/1995 Tamura (Continued)

FOREIGN PATENT DOCUMENTS

GB 2441835 3/2008
WO 9423419 10/1994

(Continued)

OTHER PUBLICATIONS

"Bode Plot." Wikipedia. N.p., Oct. 2007. Web. <http://en.wikipedia.org/wiki/Bode_plot>.*

(Continued)

*Primary Examiner* — Davetta W Goins
*Assistant Examiner* — James Mooney

(57) ABSTRACT

An electroacoustic channel soundfield is altered. An audio signal is applied by an electromechanical transducer to an acoustic space, causing air pressure changes therein. Another audio signal is obtained by a second electromechanical transducer, responsive to air pressure changes in the acoustic space. A transfer function estimate of the electroacoustic channel is established, responsive to the second audio signal and part of the first audio signal. The transfer function estimate is derived to be adaptive to temporal variations in the electroacoustic channel transfer function. Filters are obtained with transfer functions based on the transfer function estimate. Part of the first audio signal is filtered therewith.

18 Claims, 13 Drawing Sheets

(56) References Cited

U.S. PATENT DOCUMENTS

| | | | | |
|---|---|---|---|---|
| 5,602,929 | A | 2/1997 | Popovich | |
| 5,692,055 | A * | 11/1997 | Sano et al. | 381/71.11 |
| 5,774,564 | A | 6/1998 | Eguchi | |
| 6,415,034 | B1 | 7/2002 | Hietanen | |
| 7,031,460 | B1 | 4/2006 | Zheng | |
| 7,394,898 | B1 * | 7/2008 | Inoue et al. | 379/406.05 |
| 7,433,463 | B2 * | 10/2008 | Alves et al. | 379/406.14 |
| 8,270,625 | B2 * | 9/2012 | Sommerfeldt et al. | 381/71.12 |
| 2003/0185403 | A1 | 10/2003 | Sibbald | |
| 2004/0109570 | A1 * | 6/2004 | Bharitkar et al. | 381/17 |
| 2004/0264706 | A1 | 12/2004 | Ray | |
| 2005/0207585 | A1 | 9/2005 | Christoph | |

FOREIGN PATENT DOCUMENTS

| | | |
|---|---|---|
| WO | 2004045244 | 5/2004 |
| WO | 2005112849 | 12/2005 |
| WO | 2007037029 | 4/2007 |

OTHER PUBLICATIONS

Detar, "New Chip Claims to Let Cell Phone Users . . . Hear" Investor's Business Daily, A4 Tuesday, Apr. 15, 2008.

S.J. Elliiott, et al., "Multiple-Point Equalization in a Room Using Adaptive Digital Filters"; J. Audio Eng. Soc., vol. 37, No. 11, Nov. 1989; pp. 899-907.

Jot, et al., "Binaural Simulation of Complex Acoustic Scenes for Interactive Audio" AES 121st Convention, SF, CA, USA, Oct. 5-8, 2006, pp. 1-20.

Karjalainen, et al., "Frequency-Zooming ARMA Modeling of Resonant and Reverberant Systems", J. Audio Eng. Soc., vol. 50, No. 12, Dec. 2002; pp. 1012-1029.

Kuo, et al., "Active Noise Control: A Tutorial Review", proceedings of the IEEE, vol. 87, No. 6, Jun. 1999, pp. 943-973.

Mourjopoulos, et al., "A Vector Quantization Approach for Room Transfer Function Classification" 1991 IEEE, pp. 3593-3596.

X John N. Mourjopoulos: "Digital 1-8.11. Equalization of Room Acoustics" 14-16 Journal of the Audio Engineering Society. vol. 42. No. 11, Nov. 1994, pp. 884-900.

Widrow, et al., "Adaptive Inverse Control, Reissue Edition: A Signal Processing Approach", published 2008, Wiley-IEEE Press, No. of pp. 544, edition 1.

Wang, et al., "Adaptive Active Noise Control for Headphones Using the TMS320C30 DSP" Jan. 1997, Texas Instruments Incorporated, pp. 1-18.

Song, et al., "A Robust Hybrid Feedback Active Noise Cancellation Headset", IEEE Transactions on Speech and Audio Processing, vol. 13, No. 4, Jul. 2005, pp. 607-617.

Rafaely, et al., "H2/H Active Control of Sound in a Headrest: Design and Implementation", IEEE Transactions on Control Systems Technology, vol. 7, No. 1, Jan. 1999, pp. 79-84.

Morgan, et al., "A Delayless Subband Adaptive Filter Architecture", IEEE Transactions on Signal Processing, vol. 43, No. 8, Aug. 1995, pp. 1819-1830.

Widrow, et al., "Adaptive Inverse Control Based on Nonlinear Adaptive Filtering".

Eric Wan, "Adjoint LMS: An Efficient Alternative to the Filtered-X LMS and Multiple Error LMS Algorithms" 1996 IEEE, pp. 1842-1845.

Lilaroja, "Bose Headphones" from Wikipedia, the free encyclopedia.

Nam, et al., "Multiple Model Adaptive Systems for Active Noise Attenuation".

Narendra, et al., "Improving Transient Response of Adaptive Control Systems using Multiple Models and Switching" Proceedings of the 32nd Conference on Decision and Control San Antonio, Tecas-Dec. 1993, pp. 1067-1072.

Elliott, et al., "A Multiple Error LMS Algorithm and Its Application to the Active Control of Sound and Vibration", IEEE Transactions on Acoustics, Speech and Signal Processing, vol. ASSP-35, No. 10, Oct. 1987, pp. 1423-1434.

ISO 454-1975 "Acoustics-Relationbetween sound pressure levels of narrow bands of noise in a diffuse field and in a frontally-incident free field for equal loudness".

Colin H. Hansen, "Understanding Active Noise Cancellation" copyright in 2001 pp. 1-155.

Stephen Elliott, "Signal Processing for Active Noise Control (Signal Processing and Its Applications)" published on Oct. 4, 2000, publisher Academic Press.

Kuo, et al., Active Noise Control Systems: Algorithms and DSP Implementations (Wiley Series in Telecommunications and Signal Processing), 408 pages, published Jan. 1996.

Eberhard Zwicker, "Psychoacoustics: Facts and Models" published on 1990, 354 pages.

Manolakis, et al., Statistical and Adaptive Signal Processing: Spectral Estimation, Signal Modeling, Adaptive Filtering and Array Processing, published 1999.

B. Rafaely, et al., "Adaptive Plant Modelling in an Internal Model Controller for Active Control of Sound and Vibration" Proceedings of the Identification in Engineering Systems Conference, Univ of Wales, UK, p. 479-488, Mar. 1996.

Z. Jian, et al., "An Adaptive Active Noise Control Algorith Using Multiple Models", Journal of Vibration Engineering, vol. 20, No. 6, Dec. 2007.

Trinder, et al., "Active Noise Control at the Ear" Noise-Con 87, The Pennsylvania State University, State College, Pennsylvania, Jun. 8-10, 1987. pp. 392-399.

* cited by examiner

METHOD FOR ADAPTIVE CONTROL AND EQUALIZATION OF ELECTROACOUSTIC CHANNELS

CROSS-REFERENCE TO RELATED APPLICATIONS

This application claims priority to U.S. Patent Provisional Application No. 61/137,377, filed 29 Jul. 2008, hereby incorporated by reference in its entirety.

FIELD OF THE INVENTION

Various aspects of the invention relate to audio signal processing. Aspects of the invention include methods for altering the soundfield in an electroacoustic channel and methods for obtaining a set of filters whose linear combination estimates the impulse response of a time-varying transmission channel. Aspects of the invention also include apparatus for performing such methods and computer programs, stored on a computer-medium, for causing a computer to perform such methods. In particular, aspects of the invention are particularly useful for improving the audibility of portable multimedia and communication devices, particularly by reducing the effect of external environmental noise and/or by improving the understandability of speech in noisy environments. Aspects of the invention are useful generally in any environment for active noise control (ANC) and various types of equalization (including line enhancement and acoustic echo cancellation).

BACKGROUND OF THE INVENTION

Active noise control (ANC) and adaptive equalization may be used to reduce the effect of external environmental noise and/or to improve the understandability of speech in noisy environments. For example, ANC systems detect the disturbing noise signal and then generate a sound wave of equal amplitude and opposite phase, thereby reducing the perceived disturbance level.

SUMMARY OF THE INVENTION

According to a first aspect of the present invention, a method for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprises (a) establishing, in response to the second audio signal and at least a portion of the first audio signal, a transfer function estimate of the electroacoustic channel, the transfer function estimate being derived from one or a combination of transfer functions selected from a group of transfer functions, the transfer function estimate being adaptive in response to temporal variations in the transfer function of the electroacoustic channel, and (b) obtaining one or more filters whose transfer function is based on the transfer function estimate and filtering with the one or more filters at least a portion of the first audio signal, which portion of the first audio signal may or may not be the same portion as the first recited portion of the first audio signal.

The method may further comprise implementing the transfer function estimate with one or more of a plurality of time-invariant filters. The one or more filters whose transfer function is based on the transfer function estimate may have a transfer function that is an inverted version of the transfer function estimate. The transfer function estimate may be adaptive in response to a time average of temporal variations in the transfer function of the electroacoustic channel. The one or more of a plurality of time-invariant filters may be IIR filters. Alternatively, the one or more of a plurality of time-invariant filters may be two filters in cascade, the first filter being an IIR filter and the second filter being an FIR filter. In addition, the one or more filters whose transfer function is based on the transfer function estimate may be IIR filters. Alternatively, the one or more filters whose transfer function is based on the transfer function estimate may be two filters in cascade, the first filter being an IIR filter and the second filter being an FIR filter.

The transfer function estimate may be derived from one or a combination of transfer functions selected from a group of transfer functions by employing an error minimization technique. Alternatively, the transfer function estimate may be established by cross fading from one to another of the one or combination transfer functions selected from a group of transfer functions by employing an error minimization technique. Yet as a further alternative, the transfer function may be established by selecting two or more of the transfer functions from the group of transfer functions and forming a weighted linear combination of them based on an error minimization technique.

The characteristics of one or more of the group of transfer functions may include the impulse responses of the electroacoustic channel across a range of variations in impulse responses with time. The impulse responses may be measured impulse responses of real and/or simulated transmission channels.

The characteristics of the group of transfer functions may obtained according to an eigenvector method. For example, the group of transfer functions may be obtained by deriving the eigenvectors of the autocorrelation matrix of the time-invariant filter characteristics. Alternatively, the defined group of time-invariant filter characteristics may be obtained by deriving the eigenvectors resulting from performing a singular value decomposition of a rectangular matrix in which the rows of the matrix are a larger group of time-invariant filter characteristics.

The first electromechanical transducer may be one of a loudspeaker, an earspeaker, a headphone ear piece, and an ear bud.

The second electromechanical transducer is a microphone.

The acoustic space may be a small acoustic space at least partially bounded by an over-the-ear or an around-the-ear cup, the degree to which the small acoustic space is enclosed being dependant on the closeness and centering of the ear cup with respect to the ear. Variations in the transfer function of the electroacoustic channel may result from changes in the location of the small acoustical space with respect to the ear.

Each estimate of the transfer function of the electroacoustic channel may be an estimate of the channel's magnitude response within a range of frequencies.

The acoustic space may also receive an audio disturbance signal.

The acoustic space may also receive an audio disturbance and the first audio signal may include (1) an error feedback signal derived from the difference between the second audio signal and an audio signal obtained by applying the first audio signal to the filter based on the estimate of the transfer function of the electroacoustic channel, the difference being filtered by the one or more filters whose transfer function is an inverted version of the transfer function estimate, and (2) a speech and/or music audio signal.

Aspects of the invention may provide an active noise canceller in which the perceived audio response of the electroacoustic channel reduces or cancels the audio disturbance.

The first audio signal may include an audio input signal filtered by a target response filter and by the one or more filters.

Aspects of the invention may provide an equalizer in which the perceived audio response of the electroacoustic channel emulates the response of the target response filter.

The acoustic space may also receive an audio disturbance and the first audio signal may include (1) an error feedback signal derived from the difference between the second audio signal and an audio signal obtained by applying the first audio signal to the estimate of the transfer function of the electroacoustic channel, the difference being filtered by the one or more filters whose transfer function is an inverted version of the transfer function estimate, and (2) a speech and/or music audio signal filtered by a target response filter and also filtered by the one or more filters whose transfer function is an inverted version of the transfer function estimate.

Aspects of the invention may provide an active noise canceller in which the perceived audio response of the electroacoustic channel reduces or cancels the audio disturbance and also provides an equalizer in which the perceived audio response of the electroacoustic channel emulates the response of a target response filter. The target response filter may have a flat response, in which case the filter may be omitted. Alternatively, the target response filter has a diffuse field response or the target response filter characteristic may be user-specified.

The one or more filters whose transfer function is an inverted version of the transfer function estimate may comprise a lower-frequency IIR filter and an upper-frequency FIR filter in cascade.

The first audio signal comprises an artificial signal selected to be inaudible.

The establishing may respond to the second audio signal and at least a portion of the second audio signal as digital audio signals in the frequency domain.

According to another aspect of the invention, a method for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprises (a) establishing, in response to the second audio signal and at least a portion of the first audio signal, a transfer function estimate of the electroacoustic channel for a range of audio frequencies lower than an upper range of audio frequencies, the transfer function estimate being derived from one or a combination of transfer functions selected from a group of transfer functions, the transfer function estimate being adaptive in response to temporal variations in the transfer function of the electroacoustic channel, (b) obtaining one or more filters whose transfer function for the range of audio frequencies lower than an upper range of audio frequencies is based on the transfer function estimate and filtering with the one or more filters at least a portion of the first audio signal, which portion of the first audio signal may or may not be the same portion as the first recited portion of the first audio signal, and (c) obtaining one or more filters whose transfer function for a range of frequencies higher than the lower range of frequencies is variably controlled by a gradient descent minimization process.

This aspect of the invention may further comprise implementing the transfer function estimate for the range of audio frequencies lower than an upper range of audio frequencies with one or more of a plurality of time-invariant filters.

The one or more filters whose transfer function for the range of audio frequencies lower than an upper range of audio frequencies may be based on the transfer function estimate have a transfer function that is an inverted version of the transfer function estimate for the range of frequencies.

The gradient descent minimization process may be responsive to the difference between the second audio signal and an audio signal obtained by applying at least a portion of the first audio signal to the series arrangement of (a) a filter or filters estimating the electroacoustic channel transfer function for the range of audio frequencies lower than an upper range of audio frequencies and (b) a filter or filters having a time-invariant transfer response for a range of frequencies higher than the lower range of frequencies.

The filter or filters estimating the electroacoustic channel transfer function for the range of audio frequencies lower than an upper range of audio frequencies may be one or more IIR filters and the filter or filters having a time-invariant transfer response for a range of frequencies higher than the lower range of frequencies may be one or more FIR filters.

The acoustic space may also receive an audio disturbance and the first audio signal may include (1) an error feedback signal derived from the difference between the second audio signal and an audio signal obtained by applying the first audio signal to the series arrangement of (a) a filter or filters estimating the electroacoustic channel transfer function for the range of audio frequencies lower than an upper range of audio frequencies and (b) a filter or filters having a time-invariant transfer response for a range of frequencies higher than the lower range of frequencies, the difference being filtered by a series arrangement of (a) the one or more filters whose transfer function for the range of audio frequencies lower than an upper range of audio frequencies is an inverted version of the transfer function estimate and (b) one or more filters whose transfer function for a range of frequencies higher than the lower range of frequencies is variably controlled by a gradient descent minimization process, and (2) a speech and/or music audio signal.

Alternatively, the acoustic space also receives an audio disturbance and the first audio signal may include (1) an error feedback signal derived from the difference between the second audio signal and an audio signal obtained by applying the first audio signal to the series arrangement of (a) a filter or filters estimating the electroacoustic channel transfer function for the range of audio frequencies lower than an upper range of audio frequencies and (b) a filter or filters having a time-invariant transfer response for a range of frequencies higher than the lower range of frequencies, the difference being filtered by a series arrangement of (a) the one or more filters whose transfer function for the range of audio frequencies lower than an upper range of audio frequencies is an inverted version of the transfer function estimate and (b) one or more filters whose transfer function for a range of frequencies higher than the lower range of frequencies is variably controlled by a gradient descent minimization process, and (2) a speech and/or music audio signal filtered by a target response filter and also filtered by the series arrangement of filters.

According to a further aspect of the invention, a method for obtaining a set of filters whose linear combination estimates the impulse response of a time-varying transmission channel, comprises (a) obtaining M filter observations, the observations including the impulse responses of the transmission channel across its range of possible variations with time, (b) selecting N of M filters according to an eigenvector method, and (c) determining, in real-time, a linear combination of the N filters that forms an optimal estimate of the transmission channel.

The N selected filters may be determined by deriving the eigenvectors of the autocorrelation matrix of the M observations. Alternatively, the N selected filters may be determined by deriving the eigenvectors resulting from performing a Singular Value Decomposition of a rectangular matrix in which the rows of the matrix are the M observations.

A scaling factor for each of the N eigenvector filters may be obtained using a gradient-descent optimization.

The gradient-descent optimization may employ an LMS algorithm.

The M observations may be measured impulse responses of real or simulated transmission channels.

Aspects of the invention may improve the listening experience under typical (non-ideal) conditions of electroacoustic channels and their environment. An "electroacoustic channel" may be defined as an acoustic space relative to an ear in which an electromechanical transducer, such as a loudspeaker or earspeaker, causes changes in air pressure in the acoustic space, the electroacoustic channel thus including the electromechanical transducer and the acoustic space between that transducer and a listener's ear drum. In some applications such an electroacoustic channel may be bounded at least in part by a flexible or rigid ear cup. In various exemplary embodiments of the invention, a further electromechanical transducer, such as a microphone, is suitably located within the acoustic space in order to sense changes in air pressure in the acoustic space, thereby allowing the derivation of an estimate of the electroacoustic channel response.

According to aspects of the invention, an ANC and/or equalizer may adapt itself in response to short-time variations in the transfer function of the electroacoustic channel. The effect of this adaptation is to expand the listening "sweet spot". A sweet spot is the region in which the playback device may be physically located while still achieving effective results. Example embodiments of the invention provide both ANC and equalization separately or together—equalization may be added to ANC with negligible increase in implementation cost.

Aspects of the invention are applicable, for example, at least to acoustic environments characterized by high compliance transducers and relatively few, widely spaced transducer resonances. The transducer, when modeled as a linear filter, should result in the model being or approximating a minimum-phase filter. The requirement for minimum-phase transducers may be applied to a limited frequency range because ANC is generally most effective for noise signals below 1.5 kHz. ANC is particularly well suited for deployment in portable multimedia devices such as earbuds, Bluetooth headsets, portable headphones, and mobile phones, where voice communication and music playback commonly occur under conditions of highly dynamic environmental noise. Furthermore, the electroacoustic channels involved may be small (for example, mobile phone pressed against the pinna, earbuds inserted directly into the ear canal, and partially or fully-sealed headphones), implying that the acoustic resonant frequencies are further apart and variable channel resonances can be more readily accounted for in the system. Such properties may be exploited in aspects of the present invention to simplify the design of adaptive "earspeaker" systems (sound reproduction devices that are located in close proximity to a listener's ears).

Aspects of the invention address a leading cause of low performance in earspeakers—variability in the transfer function of the electroacoustic channel from the loudspeaker to the ear canal. Mobile phone users experience this phenomenon while listening to a far-end talker and, often unconsciously, "optimize" the channel by making minute adjustments to the position and angle of the phone relative to the ear. Even when sealed headphones are used, the transfer function varies depending on the quality of the acoustic seal between the earcup and the head, the position of the earcup, and specific attributes of the listener such as pinna size and shape and whether the listener is wearing eyeglasses. In an aircraft passenger environment, in which the listener is using a non-adaptive, sealed headphone, an air gap as small as 1 mm may result in a reduction of up to 11 dB of low-frequency cancellation of aircraft engine noise.

Some digital implementations of aspects of the present invention employ, adaptively, one or a linear combination of a plurality of time-invariant IIR (infinite impulse response) filters. Such an arrangement is useful, for example, in rapidly tracking changes in the electroacoustic channel.

DESCRIPTION OF EXAMPLE EMBODIMENTS

The present invention and its various aspects may involve analog or digital signals, as noted. In the digital domain, devices and processes operate on digital signal streams in which audio signals are represented by samples.

It is well known that the low frequency response of an earspeaker, such as a headphone, is attenuated as it is pulled away from the ear. Likewise, if the headphone is not in the optimal position, an air gap (acoustic leakage) may form around the headphone, and thus the low frequency response may also lowered by an amount proportional to the degree of acoustic leakage. The inventors have observed that this change in the frequency response as a function of acoustic leakage is limited to frequencies below a particular frequency value, wherein this value may be different for different earspeakers. The variation in magnitude frequency response above this frequency value may be assumed to vary less as a function of headphone leakage. The variation of the magnitude frequency response may be as much as about 15 dB at very low frequencies (about 100 Hz).

When there is a small acoustic space between an earspeaker and the ear canal, typical room reflections are not a factor in the measurements. One may assume that room acoustics do not affect such an electroacoustic channel. This simplification yields a channel that is, over a nominal frequency range, substantially minimum phase with the exception of a delay, and that has a magnitude frequency response that is invertible over a bandlimited range. The last simplification band limits the range of the electroacoustic model to a frequency range that yields minimal or shallow notches in the magnitude response so as to prevent resonant peaks that is annoying to the listener or would create potential instabilities in operation.

Frequencies below about 1.5 kHz may be ideal for electroacoustic channel system identification. One reason is that in modern analog or digital broadband noise-canceling systems (as opposed to systems that cancel periodic disturbances), the frequency range that benefits the greatest from ANC are those frequencies below 1.5 kHz. This is because the passive isolation on typical earspeakers are less effective at isolating frequencies with wavelengths longer than ⅓$^{rd}$ of a meter, than they are for shorter wavelengths. Also, because waveforms with wavelengths greater than ⅓$^{rd}$ of a meter are less affected by system latencies in the hardware, it is desirable that one should focus system identification over the range of frequencies that are most important to relevant and effective noise cancellation. Because it varies continuously across a range of magnitude responses, an electroacoustic channel may be modeled as a linear, continuously time-varying filter.

Figure 1:
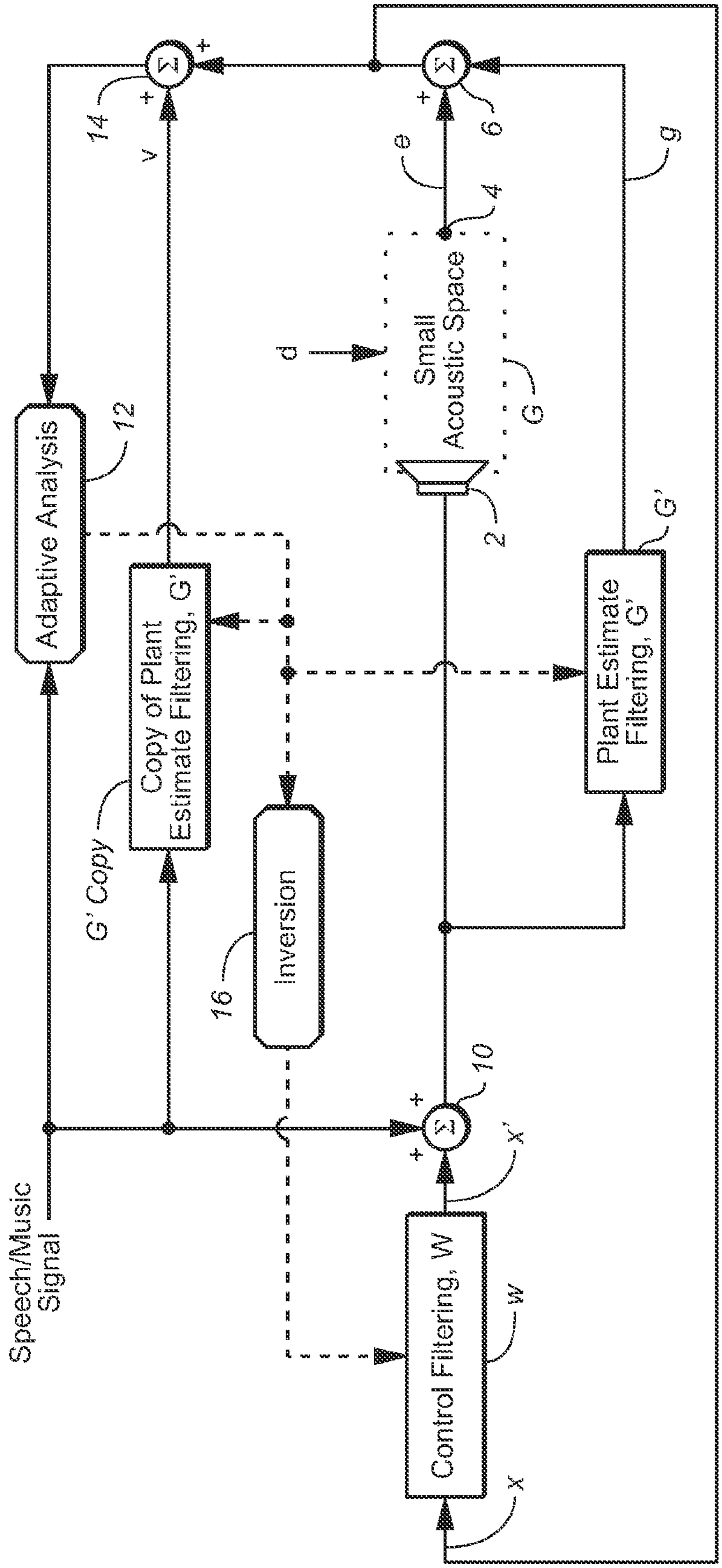
FIG. 1 is a functional block diagram of an example of a feedback-based active noise control processor or processing method according to aspects of the present invention.

FIG. 1 shows an example of a feedback-based active noise control processor or processing method, with an audio ("speech/music") input, employing aspects of the present invention. In FIG. 1 and other figures herein, solid lines indicate audio paths and dotted lines indicate the conveyance of filter defining information, including for example, parameters, to one or more filters. Certain components not necessary to the understanding of the example are not shown explicitly in FIG. 1, nor are they shown in other exemplary embodiments of aspects of the invention. For example, when the processors or processing methods of the examples of FIGS. 1-3 and 5-8 operate principally in the digital domain, a digital-to-analog converter and suitable amplification is required in order to drive the earspeaker 2 and suitable amplification along with an analog-to-digital converter is required at the output of the microphone 4. In the various figures, a like or corresponding device or function is assigned the same reference numeral.

An ANC processor or processing method, such as shown in the example of FIG. 1, seeks to alter the perceived audio output of an electroacoustic channel G in such a way as to reduce the audibility of an environmental disturbance sound. Such sounds may be any of a variety of sources including, for example, human speakers, airplane engines, room noise, street noise, acoustic echoes, etc. A first audio signal is applied to a first electromechanical transducer, such as an earspeaker 2 (shown symbolically), that causes changes in air pressure in an acoustic space, for example, a small acoustic space close to an ear (ear not shown). The acoustic space also has a second electromechanical transducer, such as a microphone 4 (shown symbolically), that responds to changes in air pressure in the acoustic space and produces a microphone signal e. The acoustic space also undergoes changes in air pressure resulting from an environmental sound disturbance d. The electroacoustic response between the earspeaker 2 and the microphone 4 may be represented as an electromechanical filter G, which mathematically models the ratio of the microphone output to the earspeaker input. This model is known in the art as the "plant."

In accordance with aspects of the invention, an estimate of the plant model G may be implemented as one or more filters or filter functions, and is shown as a plant estimating function or device ("Plant Estimate Filtering, G'"). A feedback signal is obtained by subtracting the output g of the plant model estimate G' from the output e of the plant model G in a subtractive combiner or combining function 6. If the Plant Estimate Filtering G' is ideal in its estimation of the model of the electroacoustic channel, i.e., G'=G, then the feedback path signal x from subtractor 6 is equal to the disturbance signal d. A path containing Plant Estimate Filtering G' is often referred to in the literature as the secondary path. The feedback path signal x is applied to one or more filters or filtering functions ("Control Filtering, W"), the filtering characteristics of which, in one exemplary embodiment of the invention, are substantially the inverse of the Plant Estimate Filtering G', to produce a disturbance-canceling antiphase signal x' that is summed in an additive combiner or combining function 10 with an input speech and/or music audio signal for application to the earspeaker 2.

Regarding notation, G, G' and W are the z-domain transfer functions for digital systems, or the S-domain transfer function for analog systems. The disturbance signal d and microphone signal e are equivalent time domain representations of D (see below) and E (see below), respectively.

An adaptive analyzer or adaptive analysis function ("Adaptive Analysis") 12 receives the speech and/or music audio signal directly as one input and the microphone 4 signal as another input. Ideally, one would like for the right-hand ("Microphone") input to the Adaptive Analysis 12 to be an acoustic-space-processed version of its left-hand ("Signal") input so that the Adaptive Analysis 12 input signals differ only by the condition of the plant G (this avoids a bias in obtaining the plant estimate G' filtering). For example, that may be accomplished by providing a path parallel to Adaptive Analysis 12 having another instance, a copy, of the plant estimating function or device ("Copy of Plant Estimate Filtering, G") and adding its output "V" in an additive combiner 14 to the output of combiner 6. Thus, the secondary path G' output subtracts from the V path G' output, effectively leaving the microphone output of the acoustic space as the input to the right hand side of the Analysis.

In one exemplary embodiment of the invention, the left-hand Signal Input of the Adaptive Analysis 12 represents a known signal, while the right-hand Microphone Input ideally contains only the known signal processed by the plant. The Microphone signal e contains the music signal filtered by the unknown plant G. However, environmental noise is acquired by the microphone in addition to sound from the earspeaker. The environmental noise is considered to be measurement noise from the point of view of performing system identification on the plant. The Adaptive Analysis 12 selects a filter that best models the current state of the plant. Because the measurement noise is typically uncorrelated with the speech/music signal in Adaptive Analysis 12, it does not effect the optimal filter selection.

Alternate means for generating the left-hand and right-hand inputs of Adaptive Analysis 12 are possible without departing from the spirit of the invention. For example, the left-hand input signal can be derived from the plant input signal, and the right-hand signal can be derived from an estimate of the acoustic-space-processed music signal (the Microphone signal e).

As described further below, the Adaptive Analysis 12 generates filtering parameters that, when applied to the Plant Estimate Filtering, G' and the Copy of Plant Estimate Filtering, G', result in one or more filters, respectively, that estimate the transfer function of the electroacoustic channel G. The transfer function estimate G' may be implemented by one or more of a plurality of time-invariant filters, the transfer function estimate G' being adaptive in response to variations in the transfer function G of the electroacoustic channel. As explained below, Adaptive Analysis 12 may have one of several modes of operation. There is a mapping from the filter characteristics determined by Adaptive Analysis 12 and the filterings G' and W.

The arrangement of the FIG. 1 ANC example is intended to provide a perceived audio response of the electroacoustic channel G such that the speech and/or music is heard while minimizing the audibility of the disturbance. Ideally, the antiphase signal x' acoustically cancels the disturbance signal d while not affecting the speech and/or music signal. This may be accomplished by minimizing the gain H from the disturbance D to the microphone 4. Minimizing the gain H from the disturbance D to the microphone 4 minimizes the energy transfer from the disturbance D to the error output E:

$$H = \frac{E}{D} = \frac{1 + WG}{1 - [G' - G]W} \tag{1}$$

From the above equation, one may observe that if G'≠G (indicating that the estimate of the plant G is imperfect), then the denominator is less than one and H is larger than for an ideal plant estimate. For the ideal case in which H is set to zero, one may solve for W (assuming that G'=G), and obtain an optimal control filter W:

$$W = \frac{-1}{G} \tag{2}$$

The plant estimate G' may be modeled as a minimum phase filter in cascade with a delay. In practice, the delay is approximately 3 to 4 samples at a sampling frequency of 48 kHz due to acoustic and speaker excitation latencies associated with G. But this delay may be factored out when measuring G and the resultant filter, by design, represents a transducer that is minimum phase. The above also demonstrates that adapting the system based on changes in the plant also optimizes the control filter W. In this case, W is optimal with respect to plant variation.

Inverse filtering characteristics are obtained in any suitable way by a filter inverting device or function ("Inversion") 16. For example, Inversion 16 may calculate the inversion (particularly if the filtering is a single filter), employ a lookup table, or determine the inversion in a side process or off-line by, for example, a gradient-descent method. An example of such an out-of-circuit method is described below in connection with the example of FIG. 11.

As noted above, a music or speech signal is summed with the antiphase signal at the output of Control Filtering, W. The speech/music signal is removed from the feedback path by the G' path, leaving only the disturbance as a component in the antiphase signal. The effectiveness of such signal removal is dependent on the closeness of the match between G and G'.

Aspects of the present invention also envision the adaptive pre-filtering of audio signals to compensate for physical attributes of an electroacoustic channel—in other words, to provide equalization. As with ANC, a primary contributor to the magnitude response of the electroacoustic channel is imparted by the earspeaker. Because the electroacoustic channel driver affects the magnitude response of the electroacoustic channel, a pre-filter allows the desired audio signal to compensate, within reasonable distortion limits, characteristics of the electroacoustic channel. Also, in an equalizer configuration, a desired magnitude response may be imparted upon the resultant acoustic presentation at the ear based on, for example: (1) simulation of the diffuse field response such as that described in ISO 454 (see reference 13, above), (2) user-specified equalization settings, or (3) a flat magnitude response. A diffuse field response imparts a head shadowing effect to coarsely simulate the experience of listening to music in a room. A flat response may be desirable for certain types of recordings such as binaural recordings where the spatial presentation has a priori been applied to the content under audition. The desired response of the electroacoustic channel may be specified according to a usage model, and need not have a flat magnitude response. The desired response may be static (time-invariant) or dynamic (time-variant).

Figure 2:
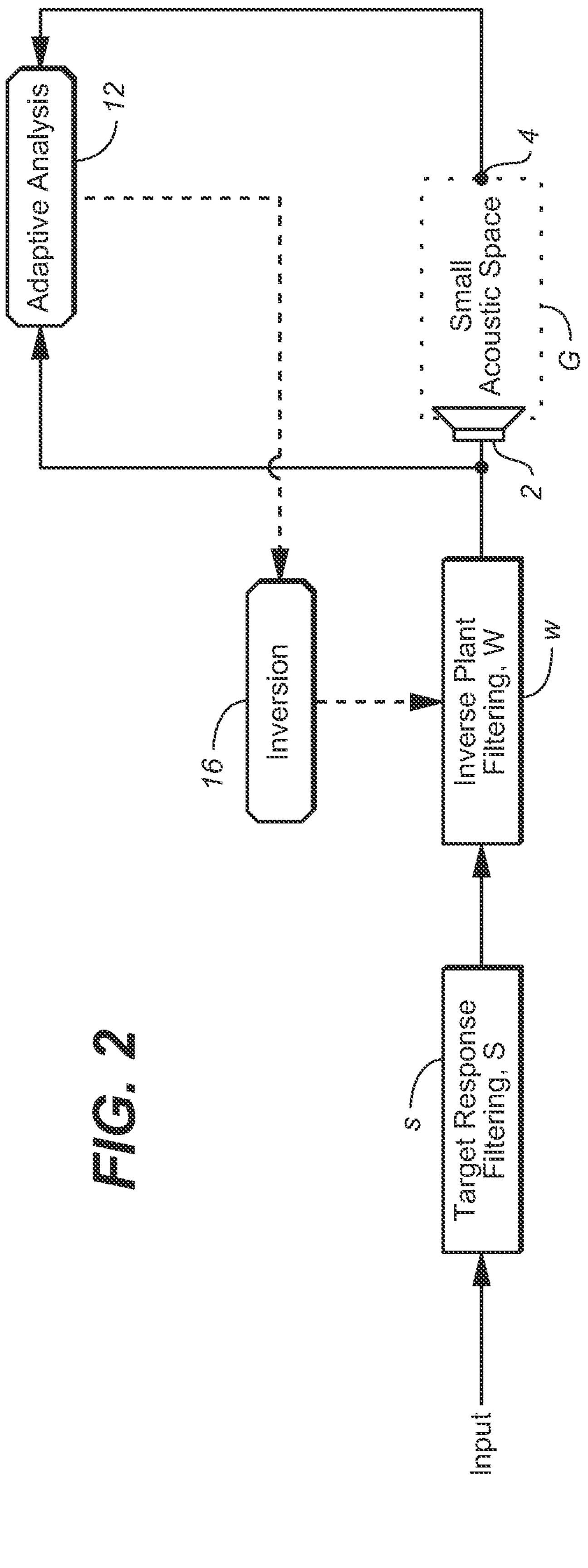
FIG. 2 is a functional block diagram of an example of an earspeaker equalizing processor or processing method according to aspects of the present invention.

FIG. 2 shows an example of an earspeaker equalizing processor or processing method with an audio ("speech/music") input employing aspects of the present invention. The audio input is applied to a target response filter or filtering process ("Target Response Filtering, S"). The target response filtering characteristic S may be static or dynamic. In series with filtering S is an inverse plant filter or filtering process (Inverse Plant Filtering, W") so as to apply a version of the audio input filtered by the series combination of filtering characteristics S and W to the earspeaker 2. As in the FIG. 1 ANC exemplary embodiment, an electroacoustic channel G receives an input from earspeaker 2 and provides an output from microphone 4. The earspeaker 2 input and the microphone 4 output are each applied as respective inputs to Adaptive Analysis 12 that generates parameters for one or more filters or filtering functions that estimate the plant response G. An inverter or inversion process ("Inversion") 16 inverts the Plant Estimate Filtering G' characteristics in any suitable manner, such as the alternatives mentioned in connection with the description of the FIG. 1 example. The inverted filtering characteristics control the Inverse Plant Filtering W.

It is desired that the perceived audio response of the electroacoustic channel G approximate as closely as possible the response of the target response filter S. The optimal equalizer may be characterized as the ratio of the desired response to that of the electroacoustic channel response:

$$E_q = SW = \frac{S}{G}. \quad (4)$$

Thus, if W is the inverse of G, the perceived output heard through the series combination of the S, W and G transfer characteristics is the S characteristic. S should be limited according to the capabilities of the audio playback system to avoid distortion and non-linearities when the earspeaker is in a non-optimal position (which may require an alteration in bass response).

Figure 3:
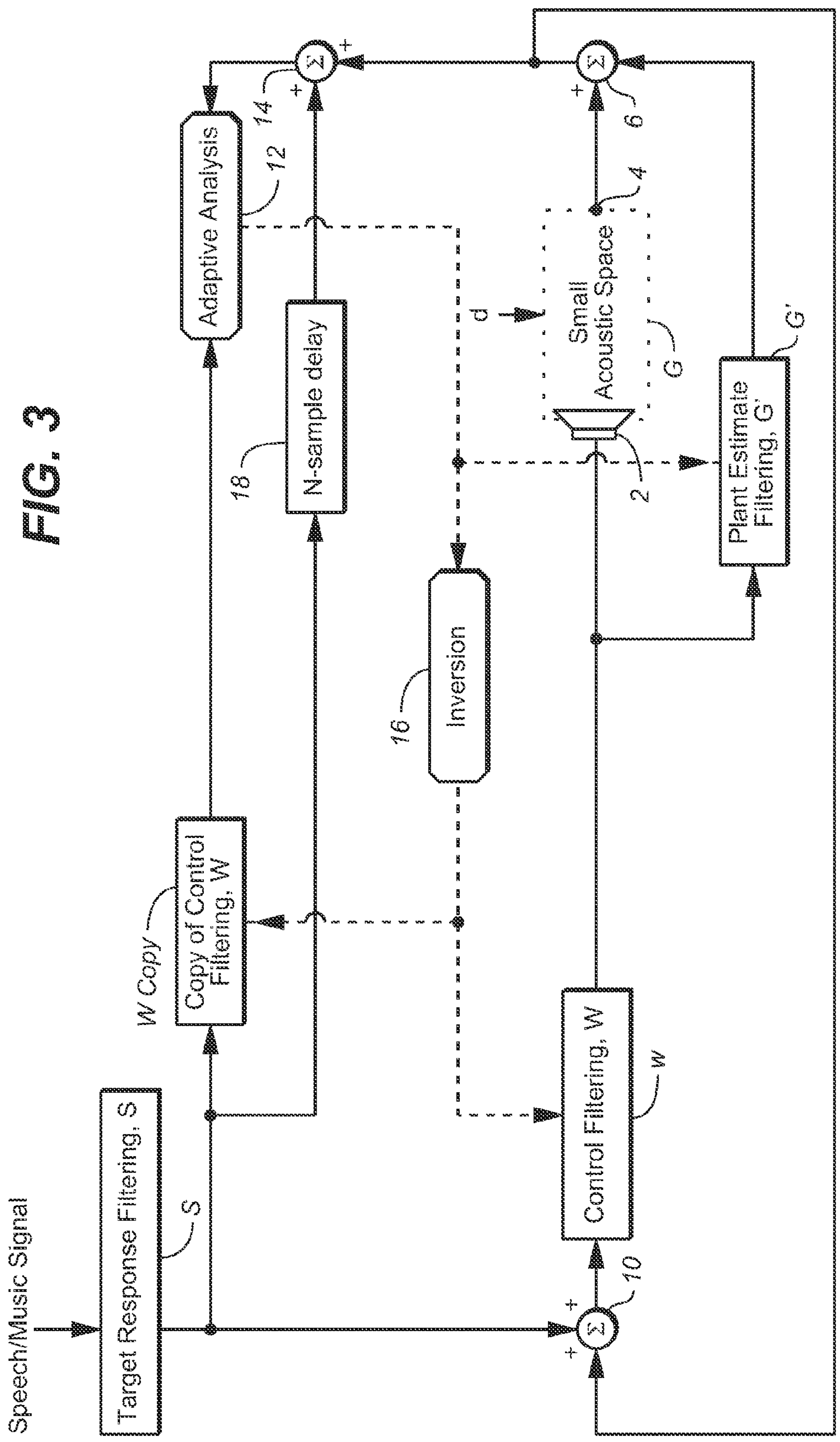
FIG. 3 is a functional block diagram of an example of a combination feedback-based active noise control and earspeaker equalizing processor or processing method according to aspects of the present invention.

FIG. 3 shows an example of a combination feedback-based ANC and earspeaker equalizing processor or processing method employing aspects of the invention. The example of FIG. 3 adds equalization to the ANC example of FIG. 1. In the FIG. 3 example, in order to provide equalization in addition to ANC, the S-filtered speech/music signal is applied to the Control Filtering W. This requires inserting a copy of the control filtering W in the left-hand input path to Adaptive Analysis 12 and in the "V" path. Because the control filtering W ideally is the inverse of the electroacoustic channel (up to a reasonable working frequency, and within the constraints of the audio playback system), there is no need for a filter W nor for a filter G' in the secondary path, because the convolution of the control filter W with respect to the estimate of the electroacoustic channel results in a uniform delay ("N-sample delay") 18.

The ANC/EQ example of FIG. 3 provides for applying the speech/music signal through a desired target response filtering S ("Target Response Filtering, S"), which may be a flat response, in which case the target response filtering is unity. If S is unity, W in cascade with the plant G, theoretically results in a flat response. Inversion 16 in FIG. 3 inverts the Plant Estimate Filtering G' in any suitable manner, such as the alternatives mentioned in connection with the description of the FIG. 1 example. The Adaptive Analysis 12 may be implemented as described below, by taking its inputs from the speech/music signal and the microphone signal. In the FIG. 3 example, the additive combiner 10 is located before rather than after the Control Filtering W in order that it affects the S filtered speech/music signal (as in the FIG. 2 example).

A requirement of processors or processing methods in accordance with the examples of FIGS. 1 and 3 is that in order to adapt the secondary path filter G', a speech or music signal needs to be present. In order to ameliorate this problem, one may freeze the adaptation when the level of the speech or music drops below a threshold, the threshold, for example, being chosen such that the signal-to-noise ratio (SNR) permits the Adaptive Analysis 12 to make a sufficiently accurate identification of the plant. An alternate solution is to inject a signal at the Adaptive Analysis 12 Input Signal that is inaudible to the listener but is recognizable by the system, even when the injected signal is below the level of the environmental noise (disturbance). Such a pilot narrowband noise may be varied in bandwidth, center frequency, and/or intensity. Such parameters may be variable over time and be selected so as to optimize the masking of this signal according to psychoacoustic principles. For example, such parameters may be selected on-line in order to keep the level of the signal at the just-noticeable-difference (JND) boundary between audibility and inaudibility.

Figure 4:
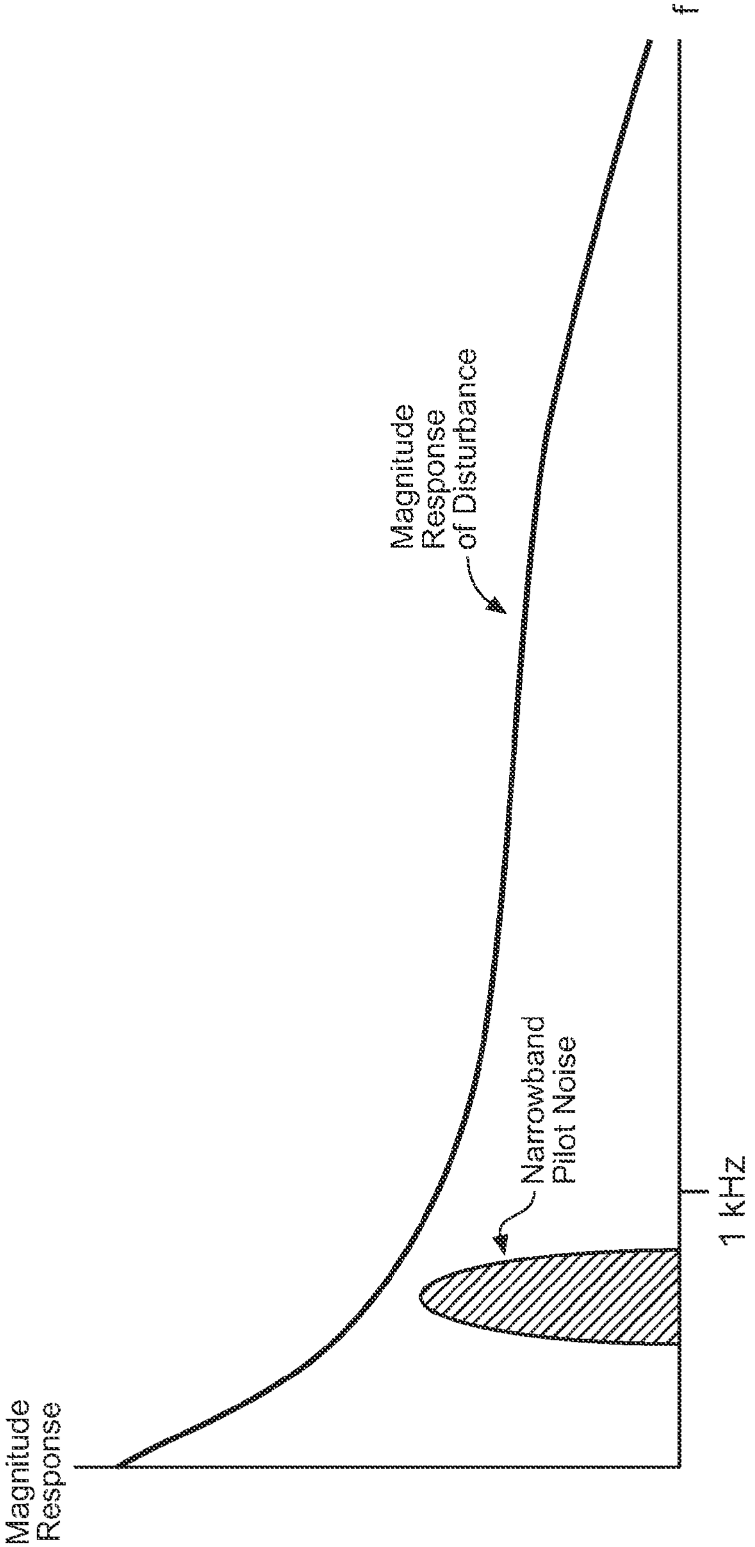
FIG. 4 is a hypothetical magnitude versus frequency response showing an example of an injection of a narrowband pilot noise signal in the presence of a wideband disturbance signal.

An example of an injection of a signal is shown with respect to an arbitrary magnitude versus frequency response in FIG. 4. Because Adaptive Analysis 12 has a priori information of the injected pilot tone (the Input Signal), the Microphone Signal may be narrowband filtered to consider only frequencies coincident with the frequencies of the pilot narrowband noise. Also, if the system has optimized the selection of parameters of the pilot noise to result in inaudibility, the pilot noise may be injected even when speech or music is present. This may improve the accuracy of the Adaptive Analysis 12 for instances when the log SNR between the music and the disturbance is negative.

The processor or processing method examples of FIGS. 1, 2 and 3 may be implemented principally in the digital or analog domains. The processor or processing method example of FIG. 5 operates principally in the digital domain. It differs from the example of FIG. 1 mainly in that in a digital implementation of FIG. 1, the Adaptive Analysis 12 operates in the frequency domain rather than the time domain. Forward transforms 18 and 20, respectively, such as Discrete Fourier Transforms (DFT) or other suitable transforms, are applied to the Adaptive Analysis 12 inputs. As is further described below, the magnitude of the complex coefficients over the frequencies of most interest (10 Hz to 500 Hz, for example) are used by the Adaptive Analysis 12 to compute the error energy. The Forward transform may be eliminated if the source audio is already in a frequency-domain representation and if the ANC system is implemented in conjunction with an upstream frequency-domain processor. Such upstream frequency-domain processors may be an audio coding system decoder (which include, but is not limited to MPEG-4 AAC, Dolby Digital, etc.). In this case, the particular selection of the frequency-domain transform may be selected to match the coded audio transform. Other frequency-domain processing algorithms may be used, and as long as the ANC system can coordinate with such processes, the forward transform on the microphone path may be eliminated.

Figure 6:
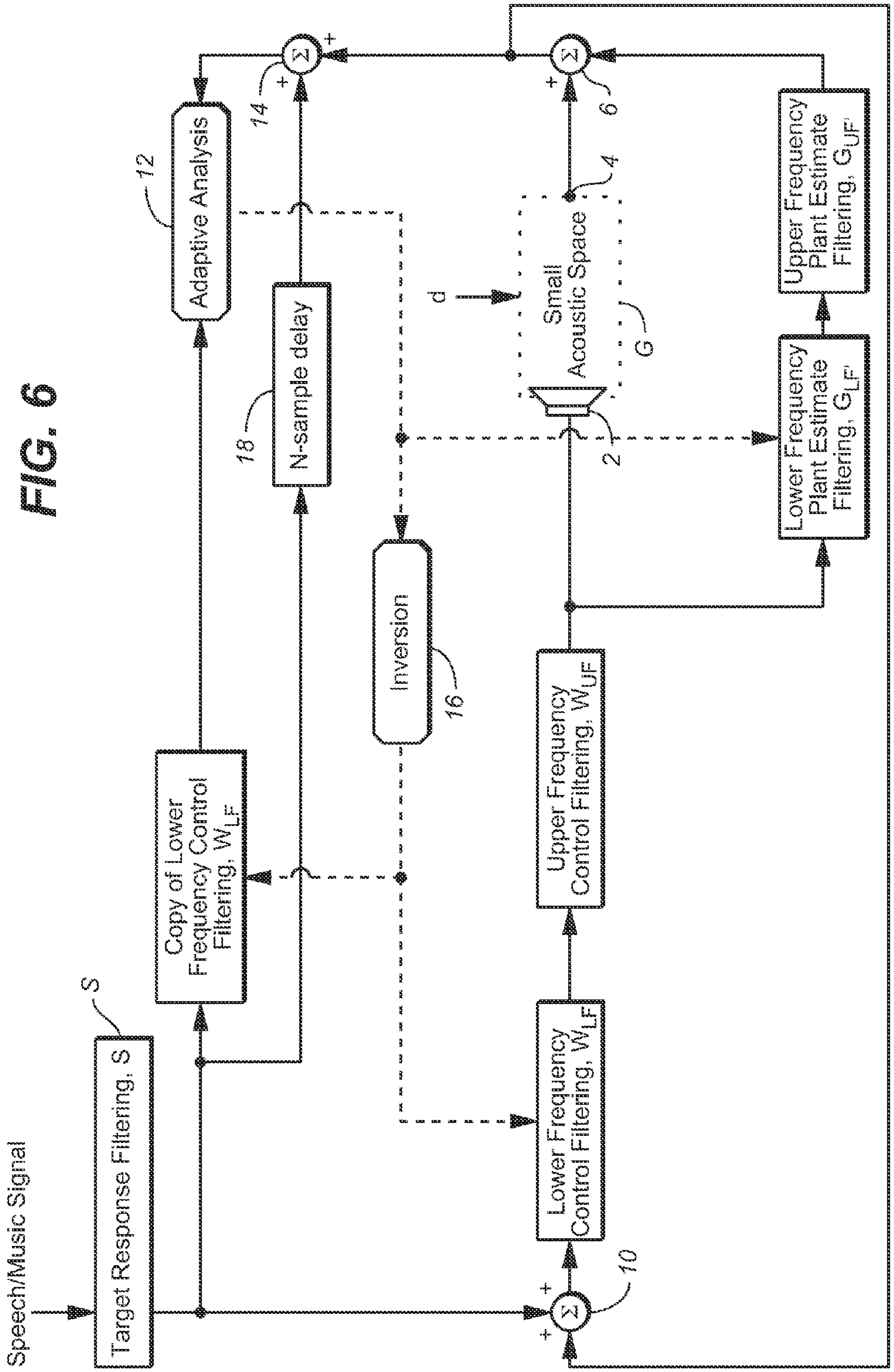
FIG. 6 is a functional block diagram of an example of a processor or processing method according to aspects of the present invention in which either or both of the control filtering and plant estimate filtering are factored into two or more filters or filtering functions arranged in cascade.

The processor or processing method example of FIG. 6 shows aspects of the present invention in which either or both of the control filtering and plant estimate filtering are factored into two or more filters or filtering functions arranged in cascade. Depending on the particular electroacoustic channel in use, it may be that within a certain frequency range, the magnitude and phase response variations are small so that a single filter models the earspeaker response with sufficient accuracy. For example, frequencies above 1.5 kHz may vary by less than 6 dB in the worst case, and by less than 3 dB in the average case. If the Adaptive Analysis 12 filters and the Low Order Filters are each single IIR digital filters, Inversion 16 may implement the Low-Order IIR Control filter by swapping the feedforward coefficients (the zeros) with the feedback coefficients (the poles). The equation for the upper frequency control filter may then be derived from the target control filtering and the lower-frequency IIR filter as follows:

$$W_{UF} = \frac{W}{W_{IIR}} \quad (5)$$

Likewise, for the secondary path filter:

$$G'_{UF} = \frac{G'}{G'_{IIR}} \quad (6)$$

In this example, the lower-frequency filter may be a low-order IIR filter, while the upper frequency may be implemented as either an FIR or IIR filter of appropriate length to model the higher-frequency features of the earspeaker. Other exemplary embodiments are possible with varying combinations of filter-types (FIR or IIR), adaptive versus static, number of filter stages, or even parallel rather than series configurations. Because the product of W·G may be constrained to be open-loop stable through an offline design of W, then the product of $W_{IIR} \cdot W_{UF} \cdot G$ is also stable. The length of the adaptive filter N for $W_{UF}$ may be reduced because $W_{LF}$ is canceling frequencies with wavelengths longer than N. A short N improves the response of the system because the N is directly proportional to the convergence time.

The upper-frequency filters $G_{UF}$ and $W_{UF}$ may be static or adaptive. If adaptive, they may switch between optimal filter coefficients based on the system identification from the Adaptive Analysis 12. Alternatively, they may be independently adaptive, entirely separate from the Adaptive Analysis, whereby a gradient-descent algorithm such as the LMS may be employed to converge to optimal upper-frequency filter coefficients. Either or both the control and the secondary path upper-frequency filters, $G_{UF}$ and/or $W_{UF}$, may be adaptive.

Figure 5:
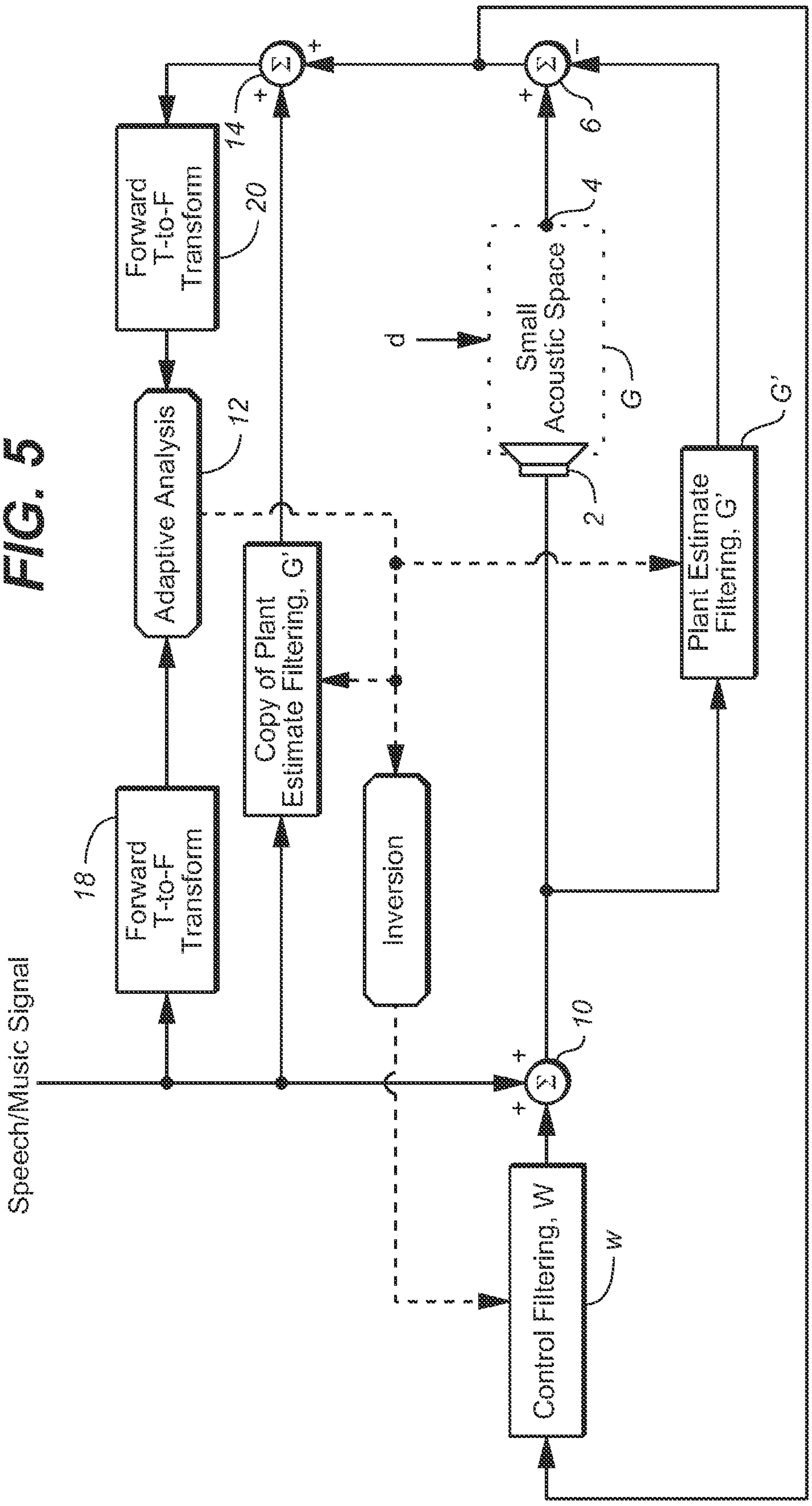
FIG. 5 is a functional block diagram of an example of a feedback-based active noise control processor or processing method according to aspects of the present invention in which the adaptive analysis operates in the frequency domain rather than the time domain.

The employment of Factored filters is also applicable to the frequency-domain example of FIG. 5.

Figure 7:
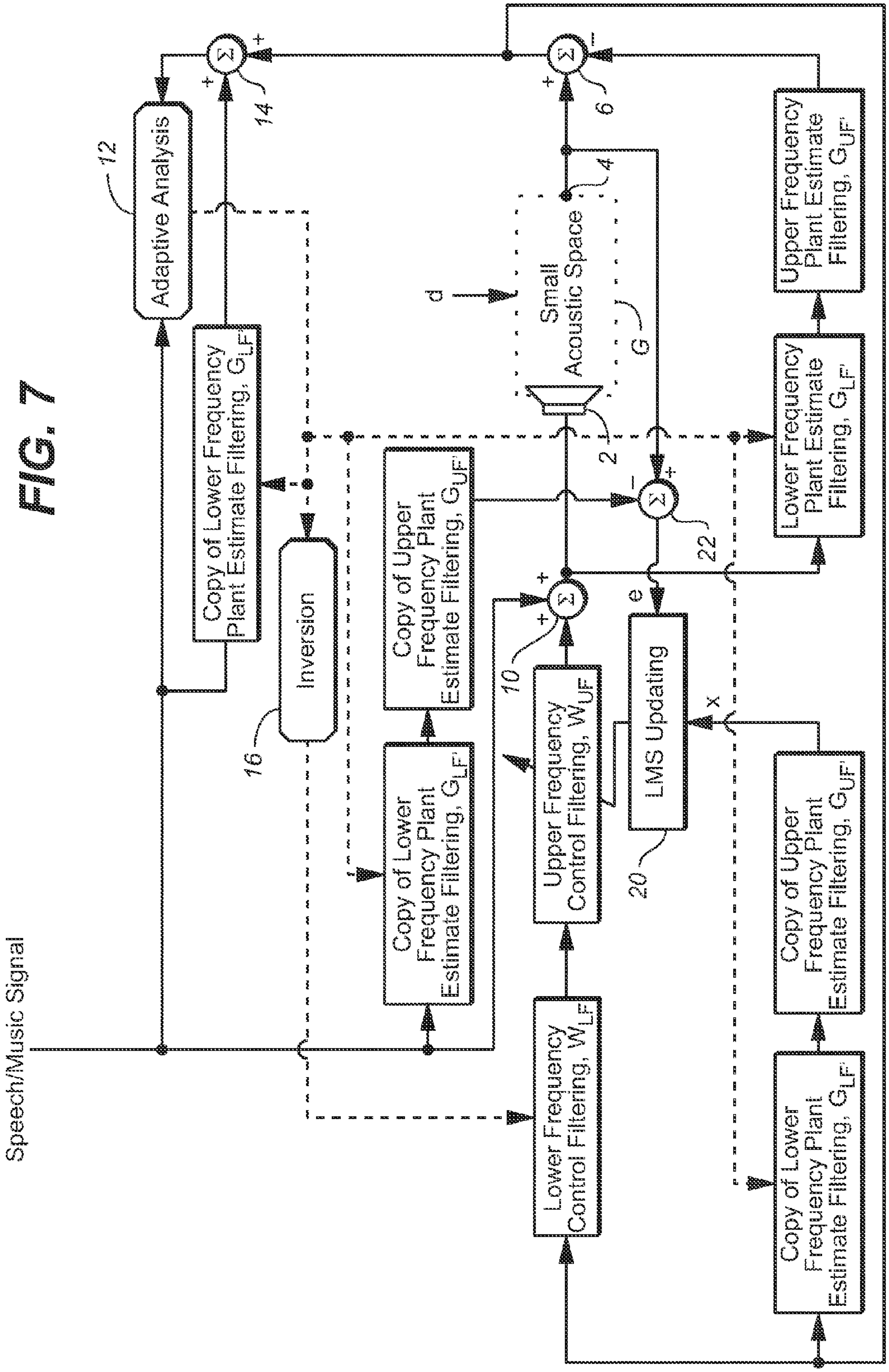
FIG. 7 is a functional block diagram of an example of an active noise control processor or processing method according to aspects of the present invention in which adaptation based on temporal variations of the plant is combined with a supplemental adaptive filtering designed to optimize the control filter based on characteristics of the disturbance signal.

FIG. 7 shows another example of a processor or processing method in accordance with aspects of the present invention. This example combines adaptation based on temporal variations of the plant with a supplemental adaptive filtering designed to optimize the control filter based on characteristics of the disturbance signal. Such a supplemental adaptive filtering may be based on the well-known FX-LMS algorithm. A controller may implement an LMS algorithm or a variant of the LMS algorithm, such as the Normalized LMS, in order to attenuate narrowband sound disturbances such as from certain types of machinery and tonal disturbances such as speech harmonics. In this case, the upper-frequency control filter $W_{UF}$, of section 4.3 is replaced by an adaptive FIR filter with coefficients derived from the classic LMS update equation:

$$w(n+1)=w(n)+\mu x(n)e(n) \quad n=0 \ldots N-1 \quad (7)$$

where w is the FIR filter coefficient vector, N is the length of the control filter $W_{UF}$, and x is a vectorized input array read from the feedback path and filtered by the plant model G'. The x vector is updated by first shifting all stored values one index value back in time, and then storing the new x sample at index=0. e is the current (scalar) sample read from the microphone. μ is the step size that is chosen to best balance stability against convergence speed.

Comparing the example of FIG. 7 to the example of FIG. 6, the Upper Frequency Control Filter, which is static, is replaced by an adaptive Upper Frequency Control filter $W_{UF}$ in which the filter coefficients are w, and an LMS Updating device or function 20 implements the LMS update equation. Because the example is a feedback-based system, the x input to the LMS update Module is derived from the feedback path, which, in accordance with the FX-LMS algorithm, is filtered by the plant model G'. The LMS Updating 20 also needs access to the microphone signal. This microphone signal contains the speech/music signal filtered by the plant, which would bias the convergence of w to a suboptimal filter. Therefore, it is necessary to remove the speech/music signal from the error update path e, which is shown as the additive combination 22 into e before it enters the LMS Updating 20. In this case, speech/music signal must be filtered by the plant estimate G' because the speech/signal in the error signal has been filtered by the plant G.

Thus, the example of FIG. 7 employs 1) the combination of the well known FX-LMS system to optimize the control filter based on characteristics of the disturbance with Adaptive Analysis 12 to optimize the system based on changes in the plant, and 2) the Upper Frequency Control Filter $W_{UF}$ in series with the Lower Frequency Control Filter $W_{LF}$, which uses coefficients derived from the Adaptive Analysis 12. The lower frequency control filter, when implemented by an IIR filter, is most effective at modeling the plant at low frequencies (below 1.5 kHz) due to the long time response of an IIR filter. This improves the degree of noise reduction at low frequencies, which dominate most environmental signal disturbances. To a certain extent, the upper frequency control filter is also capable of correcting mismatches between the plant and plant model. This form of dual-adaptation is advantageous compared to a single-adaptation method based solely on FX-LMS. To compensate for plant response changes at very low frequencies (100 Hz), a single-adaptation system would require a larger number of adaptive filter taps than a dual-adaptation system. This leads to higher computational complexity and longer adaptive filter convergence times compared to a system based on a combination of switched-adaptive filters (such as IIR filters) and FX-LMS filters.

Figure 8:
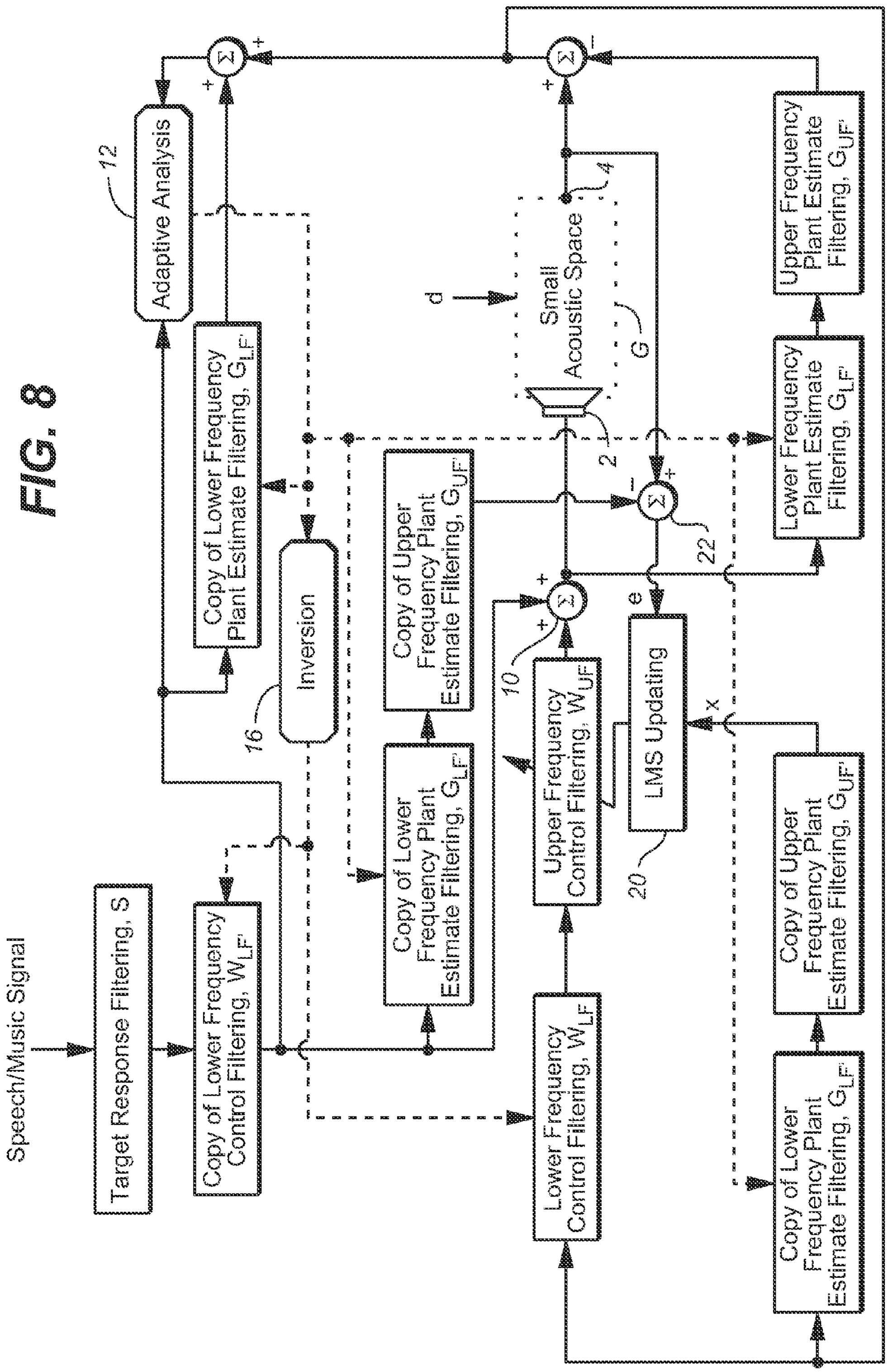
FIG. 8 is a functional block diagram of an example of an active noise control and equalization processor or processing method according to aspects of the present invention in which adaptation based on temporal variations of the plant is combined with a supplemental adaptive filtering designed to optimize the control filter based on characteristics of the disturbance signal.

FIG. 8 shows a hybrid processor or processing method arrangement similar to the example of FIG. 7, but also providing adaptive equalization, although with differences from the equalizer examples of FIGS. 3 and 6. In the FIG. 8 example, it is not possible to apply the response of the $W_{UF}$ filter to the speech/music signal because this filter is solely determined by characteristics of the disturbance. Characteristics of the disturbance are in no way related to the speech/music signal, and so the application of $W_{UF}$ should be applied only to the antiphase canceling signal. Then, a suitable method for applying the equalizing filter $W_{LF}$ to the speech/music signal is to present a new copy of $W_{LF}$ in cascade with the Target Response filter. Variations on where $W_{LF}$ is positioned in the system are possible, such as commuting the filter to locations after either the first or second speech/music branches.

Figure 9:
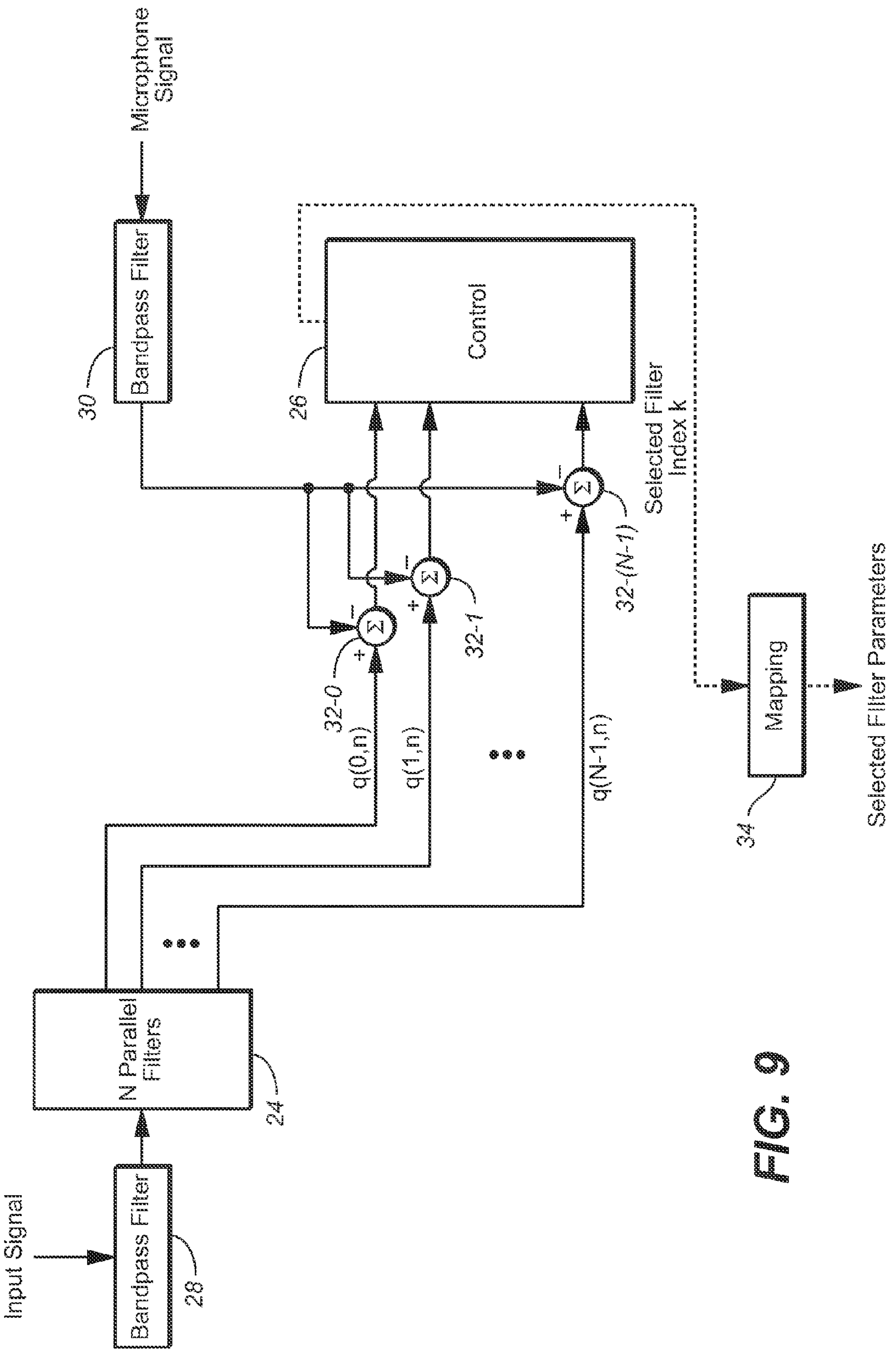
FIG. 9 is a functional block diagram of an example of an adaptive analysis device or process according to aspects of the present invention in which parameters for a single filter or filtering function are obtained.
Figure 10:
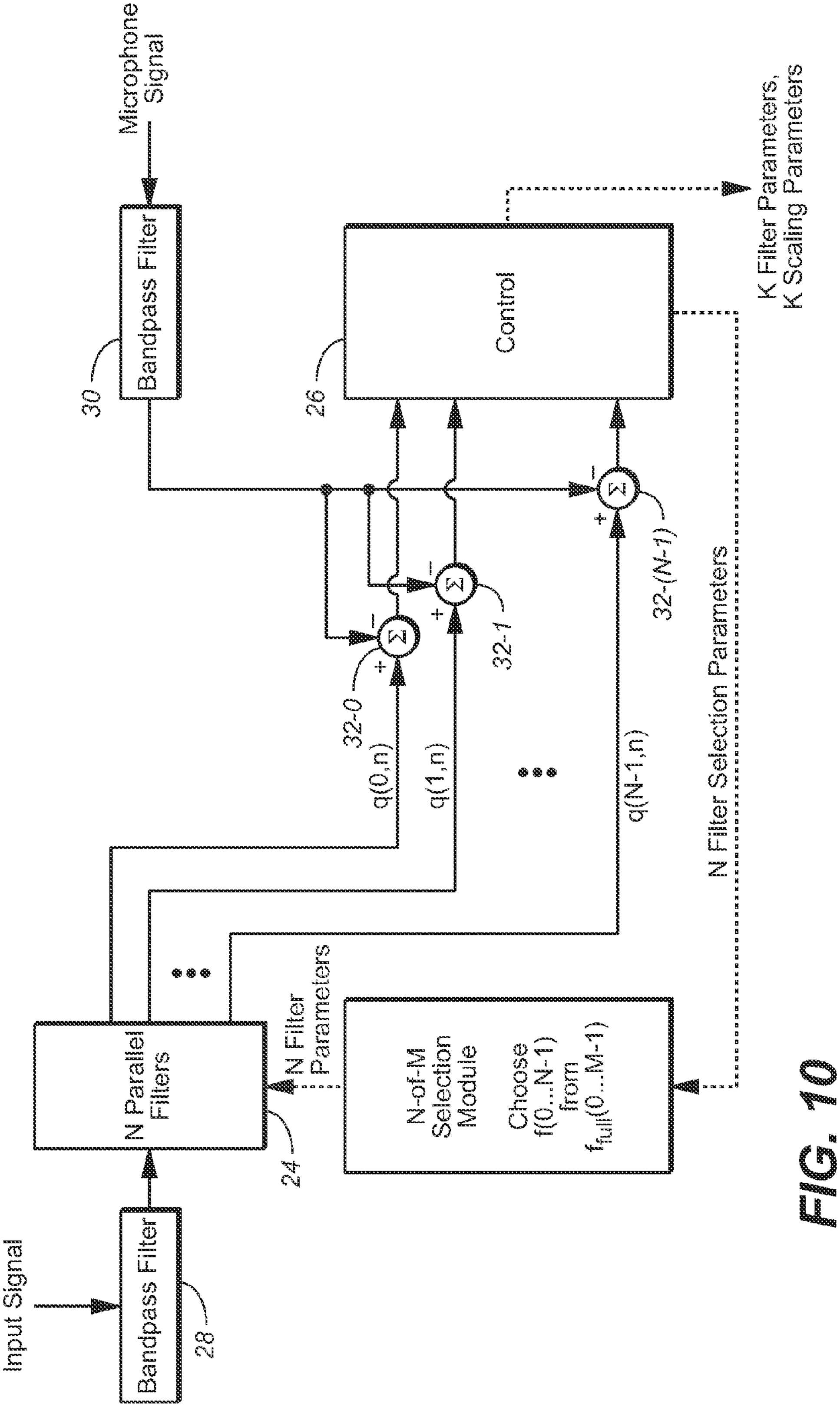
FIG. 10 is a functional block diagram of an example of an adaptive analysis device or process according to aspects of the present invention in which parameters for multiple filters or filtering functions are obtained.

FIGS. 9 and 10 show two examples of an Adaptive Analysis 12 such as that which may be employed in the processor or processing method examples of FIGS. 1-3 and 5-8. In each of those examples, the Adaptive Analysis 12 is effectively in parallel with the electroacoustic channel (plant) G. For example, the optimal filter or filters are selected by computing a measure of similarity between the filter transfer function and that of the electroacoustic channel, at least at low frequencies (for example, below about 1.5 kHz). However, any constrained frequency range may be employed provided that it yields accurate system identification.

The Adaptive Analysis 12 may operate by reference to a bank of parallel filters that represent G' for different physical variations of the plant. Each of these filters may represent, for example, a unique physical positioning of a headphone earpiece on a dummy head that may be used for measuring the impulse response of G in a particular position. Because the parallel filters only need to modify the signal at low frequencies, and because the response of electroacoustic channels varies relatively slowly across frequency, they may be implemented at very low computational cost using low to moderate-order filters. For a digital implementation, the mean-squared error between the output of each of the filters and the microphone error signal may be used to identify which of the filters best matches the plant G. For an analog implementation, comparators and logic circuitry may be used to select an optimal filter, as is described further below in connection with FIG. 12.

In the course of implementing an ANC system such as in any of the examples above, a designer may quantify the impulse response of the acoustic path at different headphone positions in order to determine limits imposable upon the adaptive algorithm during real-time operation. Because this quantification may be conducted for a known earspeaker electroacoustic path, the electroacoustic parameters of the path may be fully specified before measurement.

FIG. 9 shows an example of an Adaptive Analysis 12 for the case in which only one filter is chosen (K=1). Generally, from a set of M filters, which one may refer to as observations, the Adaptive Analysis 12 chooses N filters. From these N filters, one filter K is chosen and its index may be provided as the Analysis output.

In this example, one filter out of a possible N is selected based on a minimum mean-square error criterion. The N filters are connected in a parallel arrangement, producing in a bank of filters or filtering functions ("N Parallel Filters") 24 in which each filter processes the same bandpassed version of the Input Signal. A controller or controlling function ("Control") 26 selects the $k^{th}$ filter, depending on which of the N filters returns the minimum time-averaged mean-squared error. Adaptive Analysis 12 receives an Input Signal (corresponding to the left-hand input to Analysis 12 in FIGS. 1-3 and 5-8) and a Microphone Signal (corresponding to the right-hand input to Analysis 12 in FIGS. 1-3 and 5-8). The Input Signal and Microphone Signal, respectively, are applied via substantially identical bandpass filters 24 and 30. Their passbands include the largest variation across the different observations M. Both the Input Signal and the Microphone Signal are digital audio samples in this example. In response to those input signals, Control 26 selects one optimal filter and produces as its output the Kth index for identifying the selected filter K. A mapper or mapping function ("Mapping") 34 may map the index to a corresponding set of filter parameters. The inputs to Control 26 are the outputs of subtractive combiners 32-0 through 32-(N−1) that subtract the bandpass-filtered Microphone Signal from each of the N-filtered bandpass-filtered Input Signals, each producing an error signal, the magnitude of which is smallest for the filter N that most closely approximates the response of the plant G (see FIGS. 1-3 and 5-8). Subject to averaging, Control 26 selects the filter having the closest approximation to the plant G and outputs the index K of that filter.

Averaging may be implemented using a simple pole-zero smoothing filter. A 3 dB time constant of 70 msec (milliseconds) ($f_s$=50 kHz) has been found useful. To change from one filter selection to another, only the filter coefficients and not the filter states need to be changed. The change may be applied as an instantaneous switch from one set of coefficients to the next. In order to minimize audible artifacts incurred during the switching, the change, with respect to pole and zero values, should be small. For the K=1 case, as in this FIG. 9 example, Inversion 16 (see FIGS. 1-3 and 5-8) may be applied by pre-computing and storing an inverse filter corresponding to each of the N filters.

It is possible to crossfade from one set of filter coefficients for G' to another nearby set (in terms of the relative distance between the poles and zeros). This can be accomplished by replacing the old coefficients with new ones incrementally over time, or by allowing K=2 for an interval of time and computing the overall output as the time-varying weighted sum of both (one filter having the old set of coefficients and the other having the new set). Provided the cross-fade time is reasonably short (less than 100 msec, for example), in practice it is still possible to achieve reasonably correct system identification during such crossfading. In this case, when crossfading G' from a first set of coefficients to a nearby second set of filter coefficients, the corresponding coefficients for W may either be read from memory if the coefficients were computed offline, or computed directly as the inverse of G'.

FIG. 10 shows an example of an Adaptive Analysis 12 in which the device or process selects a linear combination of multiple filters. Generally, the Adaptive Analysis 12 chooses N filters. From these N filters, a smaller set of K filters and their relative weights may be identified so that K filter parameters and K weighting parameters may be provided as the Analysis output. Each filter, of the set of N filters, is implemented in a parallel configuration in a bank of filters or filtering functions ("N Parallel Filters") 24, in which each filter operates on the same bandpassed version of the Input Signal. In variations of the FIG. 10 example, described below, limits are placed upon N and K. In all such variations, the range of frequencies over which the Analysis performs its error analysis may be limited, for example, to the range of frequencies with the largest differences across all observations. Adaptive Analysis 12 receives an Input Signal (corresponding to the left-hand input to Analysis 12 in FIGS. 1-3 and 5-8) and a Microphone Signal (corresponding to the right-hand input to Analysis 12 in FIGS. 1-3 and 5-8). The Input Signal and Microphone Signal, respectively, are applied via substantially identical bandpass filters 24 and 30. Their passbands may include the largest variation across the different observations M. Both the Input Signal and the Microphone Signal are digital audio samples. In response to those bandpass-filtered input signals, Control 26 selects N out of M candidate filters and, as its outputs, provides K sets of filter coefficients and K weighting parameters in order to provide information for providing a linear combination of K filters (K≤N≤M), the case of K=1 being handled by an Analysis such as described above in connection with FIG. 9. Thus, M is the set of all possible filters, N is the subset of filters to test in parallel to determine the K filters, and K is the bank of parallel filters for which K sets of filter coefficients and K weighting parameters are passed to Plant Estimate Filtering and, after inversion, to Control Filtering (or Inverse Plant Filtering), as described above in connection with the examples of FIGS. 1-3 and 5-8. The inputs to Control 26 are the outputs of subtractive combiners 32-0 through 32-(N−1) that subtract the bandpass-filtered Microphone Signal from each of the N-filtered bandpass-filtered Input Signal, each producing an error signal, Control 26 selects weightings of the filters having the closest approximation to the plant G and outputs the filter parameters of that filter. Various ways of choosing a plurality of weighted filters are described below.

When K>1, the Plant Estimate Filtering in the various exemplary embodiments may be implemented by a bank of K parallel filters or filtering functions, each having a weighting coefficient. In accordance with aspects of the present invention, the filters or filtering functions controlled by the K filter parameters and K weighting parameters provided by the Analysis 12 may be IIR, FIR, or a combination of IIR and FIR filters.

One possible application of multiple filters K is to enhance crossfading from one filter to an adjacent filter (in terms of poles and zeros). As mentioned above, outputs of the K filters are mixed together using weighting coefficients produced by the Control 26. During the time interval of a crossfade, K=2; otherwise, K=1. This method may reduce audible artifacts caused by switching between two different filters in the method described earlier (when K=1).

A computationally-efficient variation on the multiple-filter method is to restrict the search to a subset of the total number of filters M. This is accomplished by assigning filter indices so that filters with similar transfer functions have indices that are adjacent to each other, and then restricting the search to the N filters neighboring the current filter having minimum mean-square error. Tracking is enabled in the Control 26 by monitoring the averaged relative mean-square error of the filter with the middle index compared to its neighbors. If, over time, the minimum error begins to move toward one of the endpoints of the set of N filters until finally a new minimum is detected, the indices of all N filters are adjusted so that the filter with the middle index continues to have the minimum mean-square error out of the set of N filters.

Another alternative of the Adaptive Analysis 12 is for it to operate in the frequency domain rather than the time domain as in the example of FIG. 5. In that case, a mean-square error analysis may be applied to the power spectral density (PSD) coefficients of both inputs to the Adaptive Analysis 12. Any time-to-frequency transform or subband filterbank may be used to perform the transformation. This would allow a large number of spectral estimation techniques to be used to improve separation of the signal (the music or speech signal played through the transducer) from the noise (the disturbance). One useful technique is to smooth the PSD coefficients over time, in the manner of a standard periodogram analysis, to assure that any bias in the power approaches zero over time. Alternatively, other spectrum estimation techniques such as the "multitaper" method may be used. This approach would also result in no significant increase in computational complexity because time-domain FIR bandpass filters (described below) in the Adaptive Analysis 12 are eliminated. Instead, the same result may be obtained by limiting the range over which the least-squares calculation is performed on the PSD coefficients. The actual forward transform has complexity on the order of M log(M) (where M is the number of frequency-domain coefficients) operations but this is still less than the order ($N^2$) complexity of the time-domain bandlimiting filters. Once the best filter or filters is (are) selected in the frequency-domain, its (their) time-domain equivalent filter or filters is (are) conveyed to the time-domain filter or filters. Thus, there is no online inverse-transformation of filter coefficients nor need there be an audio signal outputted by the Adaptive Analysis 12. Filter coefficients may be selected from a table of precomputed filter coefficients. The selection of time-domain coefficients is conducted through the analysis of frequency-domain coefficients.

Another variation on the multiple-filter linear-combination method, is for K=N and to select the N out of M filters according to an eigenvector method such that a linear combination of the N filters forms an optimal energy-minimizing filter. According to such an eigenvector filter method, the N selected filters are computed offline for a given set of M observations. The N-of-M Selection is not implemented in real-time because the N filters have already been computed off-line. The N selected filters are the eigenvectors of the autocorrelation matrix of the M observations. Alternatively, the M observations form the rows of a rectangular matrix and a Singular Value Decomposition of this rectangular matrix yield the eigenvector filters. The Control 26 then computes weighting coefficients for each of the N eigenvector filters, for example, using a gradient-descent minimization process, such as an LMS algorithm. Because all N filters are used to compute the optimal filtered output, K=N. Thus for any given electroacoustic channel impulse response, the response may be mapped to nearest principal components constructed from the N eigenvectors. Such an eigenvector filter method has the advantage that for a large value of M, (i.e., a large number of observations), a smaller number of fixed filters N may be linearly combined to form an optimal energy-minimizing filter. A derivation of the method for generating the eigenvector filters is presented below under the heading "Derivation of the Eigenvector Filter Design Process."

The Inversion device or function 16 in the examples of FIGS. 1-3 and 5-8 aims to derive a spectral inverse filter that, when applied to the control filter and analyzed in series with the plant response, results in a flat frequency response with no spectral components greater than 0 dB. For the Switched Minimum Error method, if the filter selected in the Adaptive Analysis 12 is minimum phase (excluding any delay) then there is a 1-to-1 mapping of each filter in M to a corresponding spectral inverse filter, which may be read from a table, or computed directly as the inverse of G'. For any Adaptive Analysis methods where K>1, the inverse filter coefficients is computed other than by filter inversion. For instance, the out-of-circuit network of FIG. 11 may be employed as the Inversion 16. A disadvantage of this method is that adaptation may only occur when there is signal present at the speech/music input source. In the absence of a speech/music source, the adaptation should be frozen. An alternate method that injects an inaudible probe signal during periods of no speech or music is discussed above in connection with the example of FIG. 4.

Figure 11:
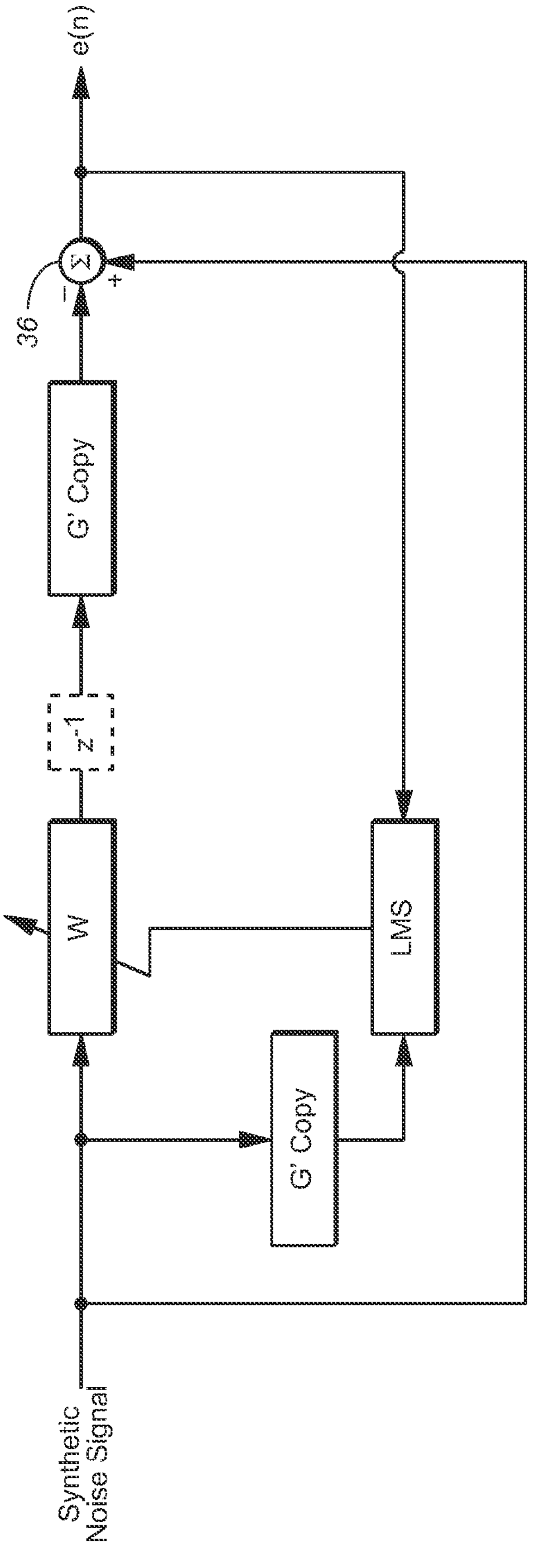
FIG. 11 is a functional block diagram of a feedback gradient-descent arrangement for deriving an inverted filtering response in response to a filtering response.

Referring to the example of FIG. 11, a feedback LMS arrangement is provided for deriving the inverted response W based on the plant estimate response G'. A noise signal d(n) is applied to the input. A first path sums the input at a subtractive combiner 60 with the output of a feedback arrangement. The feedback arrangement compares the overall output from combiner 36 with a G' Copy filtered version of the noise signal d(n), and applies a suitable gradient-descent type algorithm, such as an LMS algorithm, in order to control filtering W such that it is an inversion of G' Copy. When optimized, a delayed version of W convolved with G' Copy is unity, which results in the error output e(n) of combiner 60 being zero.

Figure 12:
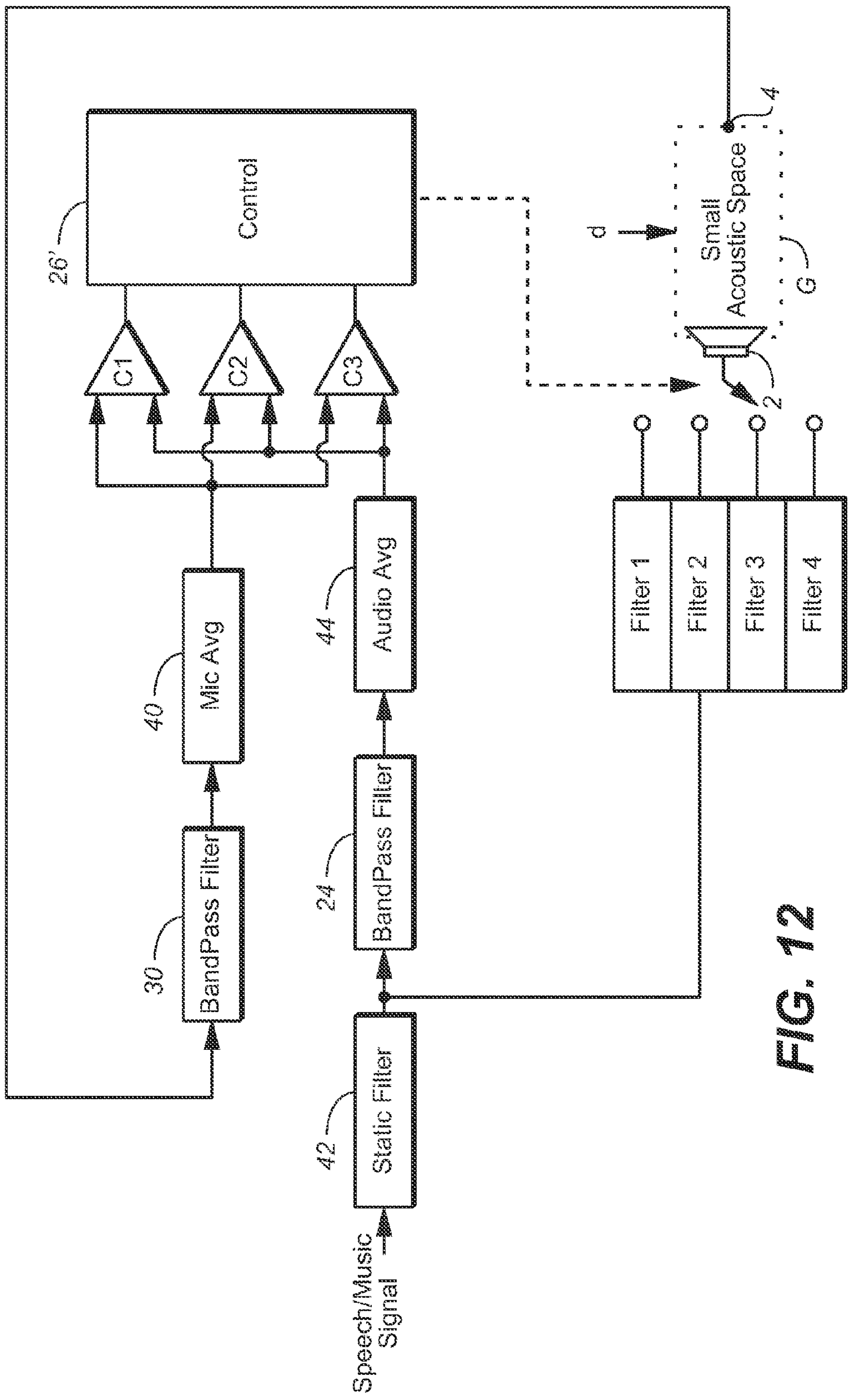
FIG. 12 is a functional block diagram of an example of a substantially analog example embodiment of a portion of an active noise control processor (or processor function) and/or equalization processor (or processor function) according to aspects of the present invention.

FIG. 12 presents an example of aspects of the invention based on analog technology. An advantage of an analog over a digital implementation is that system latencies are shorter because A/D and D/A converters are unnecessary. A microphone 4 gives a single-frequency estimate of the low-frequency response of the electroacoustic channel G, and a filter is selected from a filter bank 38 that gives the closest response to a desired response.

The output of microphone 4 is applied to a bandpass filter 30, followed, in series, by an averager or averaging function ("Mic Avg") 40. The Mic Avg 24 output is applied to an input of each of three comparators or comparator functions C1, C2 and C3. The speech/music input audio signal is applied to a static filter or filtering function ("Static Filter") 42, followed, in series, by a bandpass filter 24 and an averager or averaging function ("Audio Avg") 44. The Audio Avg 44 output is applied to an input of each of three comparators or comparator functions C1, C2 and C3. The Bandpass Filters 24 and 30 isolate a narrow band of frequencies at which the average reproduced level at low frequencies is compared with the average level in the audio program. Comparators C1, C2, and C3 have different offsets in order to give different thresholds for the decision as to which filter (1, 2, 3, 4) should be selected. The comparators may be implemented with hysteresis in order to eliminate jittering between the outputs of the various filters. Control 26 selects the filter 20 having the least squared error.

Other than employing an analog or partially analog implementation, another way to reduce latency is to implement the feedback path in the example of FIG. 3 with a 1-bit delta-sigma-sampled digital signal processing arrangement. Such 1-bit delta-sigma-modulated sampling system may sample audio at a sampling frequency as high as 64 times the base audio sampling rate. Doing so provides an updating of the anti-phase signal at a very high rate, which reduces system latency incurred by sampling the signal using traditional multi-bit sampling methods, sampled at the standard audio sample rate. A 1-bit delta-sigma A/D converter at combiner 6 in FIG. 3 and a 1-bit delta-sigma D/A converter at the loudspeaker 2 in FIG. 3 would be required. In addition, the control filter W and secondary path filter G' would apply multi-bit filter coefficients to the 1-bit intermediate-filter-state values, which would result in a multi-bit output at the filter outputs. The multi-bit output values from each filter would then be transformed back to 1-bit values through the incorporation of a delta-sigma modulator. Other combinations of filters and delta-sigma modulators are possible, such as performing a single multi-bit to delta-sigma modulator conversion immediately before the 1-bit delta-sigma D/A converter. Depending on the specific implementation, the speech and/or music audio signal may need to be modulated from a multi-bit to a 1-bit delta-sigma representation at the summation 10.

In the analog example of FIG. 12, including digital variations thereof, measuring the change in electroacoustic channel response at a single frequency has a problem in that the variation in the range of sensitivities of an earspeaker and of a microphone is each almost as great as the variation in response associated with changes in the acoustical loading conditions. The assumption is that the gain in the middle of the band defined by the bandpass filters should be substantially equal in both the 'mic AVG' and 'audio AVG' signal paths. Thus, a way to compensate variations in the sensitivities of the microphone and earspeaker should be provided.

Another alternative example that embodies aspects of the present invention is a hybrid digital/analog exemplary embodiment in which the Adaptive Analysis 12 operates on digital samples of both the speech/music signal and the microphone signal, but then applies analog filter parameters (shown as Filter 1 through Filter 4 in the example of FIG. 12) to analog implementations of the control filtering W and the plant estimate filtering G'.

Derivation of the Eigenvector Filter Design Process

In order to derive a set of eigenvector filters for use in the eigenvector alternative mentioned above, one needs to compute K (or N, K=N) eigenvector filters based on a set of M observations. Calculation of eigenvector filters C may occur off-line. The eigenvector filter coefficients may be stored in a suitable non-volatile computer memory.

Selection of N Base Filters

One may start from a general case in which the filter to be modeled is characterized by a random filter $$P(z) = \sum_{j=0}^{L-1} p_j z^{-j}$$

having random real coefficients $p=(p_0, \ldots, p_{L-1})^T$. The objective is to find a set of N base filters $$C_i(z) = \sum_{j=0}^{L-1} c_{i,j} z^{-j},\ i = 1, \ldots, N,\ N < L,$$

with real coefficients $c_i=(c_{i,0}, \ldots, c_{i,L-1})^T$, such that $$\begin{aligned} J(C) &= E\left\{\int_0^{2\pi}\left|P(e^{j\omega}) - \sum_{i=1}^{N} w_i C_i(e^{j\omega})\right|^2 d\omega\right\} \\ &= E\{\|p - C^T w\|\} \end{aligned} \tag{8}$$

is minimized. In equation 8, E{□} is the statistical expectation with respect to the distribution of the random coefficients of p, $$\|v\|\square v^T v,\ C\square(c_1, \ldots, c_N)^T,$$

and $w\square(w_1, \ldots, w_N)^T$ is a real vector that minimizes $\|p-C^T w\|$ for given p and C. Without lost of generality one may further assume $c_i$ are orthonormal vectors, i.e., $$c_i^T c_j = \begin{cases} 1 & i = j \\ 0 & \text{else.} \end{cases}$$

Because $$\|p-C^T w\| = p^T p + w^T C C^T w - 2p^T C^T w.$$

Recognizing that $CC^T=I$, partially differentiating the above expression with respect to w, and setting the derivative to zero, one has w=Cp.

Replace the above into (1) one has $$\begin{aligned} J(C) &= E\{p^T p - p^T C^T C p\} \\ &= E\{p^T p\} - E\left\{\sum_{i=1}^{N} c_i^T p p^T c_i\right\} \\ &= E\{p^T p\} - \sum_{i=1}^{N} c_i^T R c_i, \end{aligned}$$

where $$R\square E\{pp^T\}.$$

Clearly, the coefficient vectors $c_i$, i=1, . . . , N that minimizes J also maximizes $$\sum_{i=1}^{N} c_i^T R c_i,$$

which turn out to be the N eigenvectors corresponding to the N largest eigenvalues of the covariance matrix R. That is:

$$Rc_i=\lambda_i c_i,\ i=1, \ldots, N,$$

and $\lambda_i$, i=1, . . . , N are the N largest scalars that satisfy the above equations.

A more generalized solution can be obtained by adding a frequency weighting function W(ω) to the cost function J(C), which can be quite useful in practical applications.

$$J(C) = E\left\{ \int_0^{2\pi} \left| P(e^{j\omega}) - \sum_{i=1}^{N} w_i C_i(e^{j\omega}) \right|^2 W(\omega)\, d\omega \right\}$$

Consider a more specific case in which the filter to be modeled is from M observed plant filters $$G_i(z) = \sum_{j=0}^{L-1} g_i(j) z^{-j},\ i = 1, 2, \ldots, M.$$

Noting that in this case one is trying to model a random filter of M equally probable filters $G_i(z)$ for which the covariance matrix is given by:

$$R = \sum_{i=1}^{M} g_i^T g_i,$$

where $g_i=(g_i(0), g_i(1), \ldots, g_i(L-1))^T$, the coefficients of the N base filters $C_1(z), \ldots, C_N(z)$ are thus given by the eigenvector $c_i$ corresponding to the N largest eigenvalues $\lambda_i$ of the covariance matrix R.

The actual number of the base filter N can be decided either by complexity constraints, or quality constraints, e.g., the sum of the remaining eigenvalues satisfies $$\sum_{i=N+1}^{L} \lambda_i < \varepsilon$$

where ϵ is a pre-determined maximum design tolerance.

In practice, it is also possible to use IIR filters that have frequency responses that approximate those of the Eigenvector filters as the N base filters for further complexity reduction. The IIR base filters can be designed from $C_1(z), \ldots, C_N(z)$ by using, e.g., a suitable error minimizing process such as a least-square-fit algorithm.

LMS Adaptation of Weighting Coefficients

Figure 13:
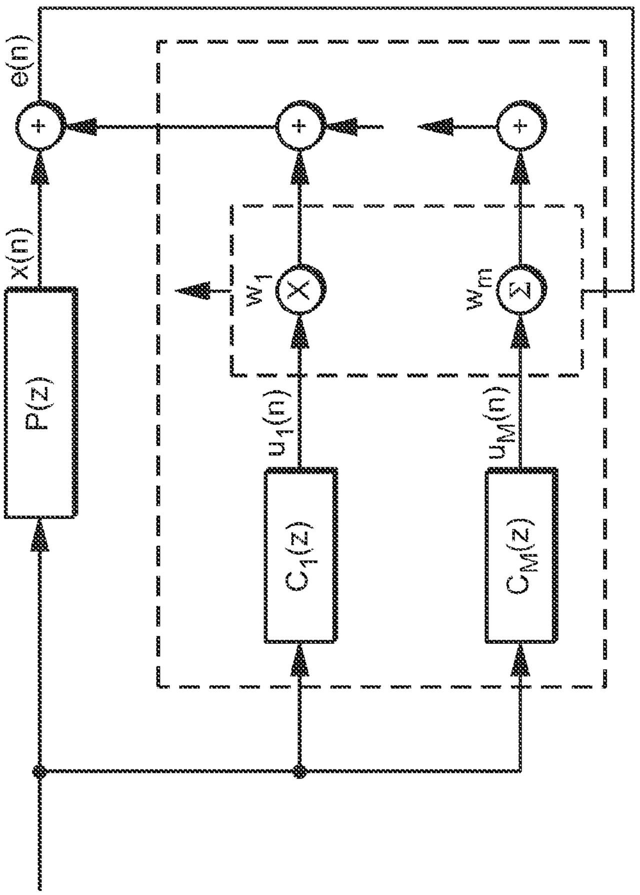
FIG. 13 is a functional block diagram of a gradient-descent minimization arrangement for determining the optimal weighting of a set of set of filters or filtering functions.

Once the N base filters have been computed, the optimal weighting w that provides the least square fit for a given unknown electroacoustic channel may be obtained by using a gradient-descent minimization process such as an LMS algorithm. An example is shown in FIG. 13. In the FIG. 13 example, the error signal e(n) is given by $$e(n)=x(n)-w^T(n)u(n),$$

where $u(n)\square(u_1(n), \ldots, u_N(n))^T$ are the respective outputs of the N base filters. The filter weightings w(n) are updated as: w(n+1)=w(n)+μw(n)e(n).

Implementation

The invention may be implemented in hardware or software, or a combination of both (e.g., programmable logic arrays). Unless otherwise specified, algorithms and processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program may be stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

An embodiment of the present invention may relate to one or more of the example embodiments enumerated below.

1. A method for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprising: establishing, in response to the second audio signal and at least a portion of the first audio signal, a transfer function estimate of the electroacoustic channel, said transfer function estimate being derived from one or a combination of transfer functions selected from a group of transfer functions, said transfer function estimate being adaptive in response to temporal variations in the transfer function of the electroacoustic channel, and obtaining one or more filters whose transfer function is based on the transfer function estimate and filtering with the one or more filters at least a portion of the first audio signal, which portion of the first audio signal may or may not be the same portion as said first recited portion of the first audio signal.

2. A method according to enumerated example embodiment 1 further comprising implementing said transfer function estimate with one or more of a plurality of time-invariant filters.

3. A method according to enumerated example embodiment 1 or enumerated example embodiment 2 wherein said one or more filters whose transfer function is based on the transfer function estimate have a transfer function that is an inverted version of the transfer function estimate.

4. A method according to any one of enumerated example embodiments 1-3 wherein the transfer function estimate is adaptive in response to a time average of temporal variations in the transfer function of the electroacoustic channel.

5. A method according to enumerated example embodiment 3 or enumerated example embodiment 4 as dependent on enumerated example embodiment 2 wherein said one or more of a plurality of time-invariant filters are IIR filters.

6. A method according to enumerated example embodiment 3 or enumerated example embodiment 4 as dependent on enumerated example embodiment 2 wherein said one or more of a plurality of time-invariant filters are two filters in cascade, the first filter being an IIR filter and the second filter being an FIR filter.

7. A method according to any one of enumerated example embodiments 1-6 wherein said one or more filters whose transfer function is based on the transfer function estimate are IIR filters.

8. A method according to any of enumerated example embodiments 1-6 wherein said one or more filters whose transfer function is based on the transfer function estimate are two filters in cascade, the first filter being an IIR filter and the second filter being an FIR filter.

9. A method according to any one of enumerated example embodiments 1-8 wherein said transfer function estimate is derived from one or a combination of transfer functions selected from a group of transfer functions by employing an error minimization technique.

10. A method according to any one of enumerated example embodiments 1-8 wherein said transfer function estimate is established by cross fading from one to another of said one or combination transfer functions selected from a group of transfer functions by employing an error minimization technique.

11. A method according to any one of enumerated example embodiments 1-8 wherein said transfer function is established by selecting two or more of said transfer functions from said group of transfer functions and forming a weighted linear combination of them based on an error minimization technique.

12. A method according to any one of enumerated example embodiments 1-11 wherein the characteristics of one or more of the group of transfer functions includes the impulse responses of the electroacoustic channel across a range of variations in impulse responses with time.

13. A method according to enumerated example embodiment 12 wherein the impulse responses are measured impulse responses of real and/or simulated transmission channels.

14. A method according to enumerated example embodiment 12 wherein the characteristics of said group of transfer functions are obtained according to an eigenvector method.

15. A method according to enumerated example embodiment 14 wherein the group of transfer functions are obtained by deriving the eigenvectors of the autocorrelation matrix of the time-invariant filter characteristics.

16. A method according to enumerated example embodiment 14 wherein the defined group of time-invariant filter characteristics are obtained by deriving the eigenvectors resulting from performing a singular value decomposition of a rectangular matrix in which the rows of the matrix are a larger group of time-invariant filter characteristics.

17. A method according to any one of enumerated example embodiments 1-16 wherein said first electromechanical transducer is one of a loudspeaker, an earspeaker, a headphone ear piece, and an ear bud.

18. A method according to any one of enumerated example embodiments 1-17 wherein said second electromechanical transducer is a microphone.

19. A method according to any one of enumerated example embodiments 1-18 wherein said acoustic space is a small acoustic space at least partially bounded by an over-the-ear or an around-the-ear cup, the degree to which the small acoustic space is enclosed being dependant on the closeness and centering of the ear cup with respect to the ear.

20. A method according to enumerated example embodiment 19 wherein said variations in the transfer function of the electroacoustic channel result from changes in the location of the small acoustical space with respect to said ear.

21. A method according to any one of enumerated example embodiments 1-20 wherein each estimate of the transfer function of the electroacoustic channel is an estimate of the channel's magnitude response within a range of frequencies.

22. A method according to any one of enumerated example embodiments 1-21 wherein said acoustic space also receives an audio disturbance signal.

23. A method according to any one of enumerated example embodiments 1-21 wherein said acoustic space also receives an audio disturbance and said first audio signal includes (1) an error feedback signal derived from the difference between the second audio signal and an audio signal obtained by applying said first audio signal to the filter based on the estimate of the transfer function of the electroacoustic channel, said difference being filtered by said one or more filters whose transfer function is an inverted version of the transfer function estimate, and (2) a speech and/or music audio signal.

24. A method according to enumerated example embodiment 23 wherein the method provides an active noise canceller in which the perceived audio response of the electroacoustic channel reduces or cancels the audio disturbance.

25. A method according to any one of enumerated example embodiments 1-21 wherein said first audio signal includes an audio input signal filtered by a target response filter and by said one or more filters.

26. A method according to enumerated example embodiment 25 wherein the method provides an equalizer in which the perceived audio response of the electroacoustic channel emulates the response of the target response filter.

27. A method according to any one of enumerated example embodiments 1-21 wherein said acoustic space also receives an audio disturbance and said first audio signal includes (1) an error feedback signal derived from the difference between the second audio signal and an audio signal obtained by applying said first audio signal to the estimate of the transfer function of the electroacoustic channel, said difference being filtered by said one or more filters whose transfer function is an inverted version of the transfer function estimate, and (2) a speech and/or music audio signal filtered by a target response filter and also filtered by said one or more filters whose transfer function is an inverted version of the transfer function estimate.

28. A method according to enumerated example embodiment 27 wherein the method provides an active noise canceller in which the perceived audio response of the electroacoustic channel reduces or cancels the audio disturbance and also provides an equalizer in which the perceived audio response of the electroacoustic channel emulates the response of the target response filter.

29. A method according to enumerated example embodiment 26 or enumerated example embodiment 28 in which the target response filter has a flat response, whereby the filter may be omitted.

30. A method according to enumerated example embodiment 26 or enumerated example embodiment 28 in which the target response filter has a diffuse field response.

31. A method according to enumerated example embodiment 26 or enumerated example embodiment 28 in which the target response filter characteristic is user-specified.

32. A method according to enumerated example embodiment 23 or enumerated example embodiment 27 wherein said one or more filters whose transfer function is an inverted version of the transfer function estimate comprise a lower-frequency IIR filter and an upper-frequency FIR filter in cascade.

33. A method according to any one of enumerated example embodiments 1-21 wherein said first audio signal comprises an artificial signal selected to be inaudible.

34. A method according to any one of enumerated example embodiments 1-32 wherein said establishing responds to the second audio signal and at least a portion of the second audio signal as digital audio signals in the frequency domain.

35. A method for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprising establishing, in response to the second audio signal and at least a portion of the first audio signal, a transfer function estimate of the electroacoustic channel for a range of audio frequencies lower than an upper range of audio frequencies, said transfer function estimate being derived from one or a combination of transfer functions selected from a group of transfer functions, said transfer function estimate being adaptive in response to temporal variations in the transfer function of the electroacoustic channel, obtaining one or more filters whose transfer function for said range of audio frequencies lower than an upper range of audio frequencies is based on the transfer function estimate and filtering with the one or more filters at least a portion of the first audio signal, which portion of the first audio signal may or may not be the same portion as said first recited portion of the first audio signal, and obtaining one or more filters whose transfer function for a range of frequencies higher than said lower range of frequencies is variably controlled by a gradient descent minimization process.

36. A method according to enumerated example embodiment 35 further comprising implementing said transfer function estimate for said range of audio frequencies lower than an upper range of audio frequencies with one or more of a plurality of time-invariant filters.

37. A method according to enumerated example embodiment 35 or 36 wherein said one or more filters whose transfer function for said range of audio frequencies lower than an upper range of audio frequencies is based on the transfer function estimate have a transfer function that is an inverted version of the transfer function estimate for said range of frequencies.

38. A method according to enumerated example embodiment 35 wherein the gradient descent minimization process is responsive to the difference between said second audio signal and an audio signal obtained by applying at least a portion of said first audio signal to the series arrangement of (a) a filter or filters estimating the electroacoustic channel transfer function for said range of audio frequencies lower than an upper range of audio frequencies and (b) a filter or filters having a time-invariant transfer response for a range of frequencies higher than said lower range of frequencies.

39. A method according to enumerated example embodiment 38 wherein the filter or filters estimating the electroacoustic channel transfer function for said range of audio frequencies lower than an upper range of audio frequencies is or are IIR filters and the filter or filters having a time-invariant transfer response for a range of frequencies higher than said lower range of frequencies is or are FIR filters.

40. A method according to any one of enumerated example embodiments 1-3 wherein said acoustic space also receives an audio disturbance and said first audio signal includes (1) an error feedback signal derived from the difference between the second audio signal and an audio signal obtained by applying said first audio signal to the series arrangement of (a) a filter or filters estimating the electroacoustic channel transfer function for said range of audio frequencies lower than an upper range of audio frequencies and (b) a filter or filters having a time-invariant transfer response for a range of frequencies higher than said lower range of frequencies, said difference being filtered by a series arrangement of (a) said one or more filters whose transfer function for said range of audio frequencies lower than an upper range of audio frequencies is an inverted version of the transfer function estimate and (b) one or more filters whose transfer function for a range of frequencies higher than said lower range of frequencies is variably controlled by a gradient descent minimization process, and (2) a speech and/or music audio signal.

41. A method according to any one of enumerated example embodiments 35-39 wherein said acoustic space also receives an audio disturbance and said first audio signal includes (1) an error feedback signal derived from the difference between the second audio signal and an audio signal obtained by applying said first audio signal to the series arrangement of (a) a filter or filters estimating the electroacoustic channel transfer function for said range of audio frequencies lower than an upper range of audio frequencies and (b) a filter or filters having a time-invariant transfer response for a range of frequencies higher than said lower range of frequencies, said difference being filtered by a series arrangement of (a) said one or more filters whose transfer function for said range of audio frequencies lower than an upper range of audio frequencies is an inverted version of the transfer function estimate and (b) one or more filters whose transfer function for a range of frequencies higher than said lower range of frequencies is variably controlled by a gradient descent minimization process, and (2) a speech and/or music audio signal filtered by a target response filter and also filtered by said series arrangement of filters.

42. A method for obtaining a set of filters whose linear combination estimates the impulse response of a time-varying transmission channel, comprising obtaining M filter observations, the observations including the impulse responses of the transmission channel across its range of possible variations with time, selecting N of M filters according to an eigenvector method, determining, in real-time, a linear combination of the N filters that forms an optimal estimate of the transmission channel.

43. The method of enumerated example embodiment 42 wherein the N selected filters are determined by deriving the eigenvectors of the autocorrelation matrix of the M observations.

44. The method of enumerated example embodiment 42 wherein the N selected filters are determined by deriving the eigenvectors resulting from performing a Singular Value Decomposition of a rectangular matrix in which the rows of the matrix are said M observations.

45. The method of any one of enumerated example embodiments 42-44 wherein a scaling factor for each of the N eigenvector filters is obtained using a gradient-descent optimization.

46. The method of enumerated example embodiment 45 wherein said gradient-descent optimization employs an LMS algorithm.

47. The method of any one of enumerated example embodiments 42-46 wherein said M observations are measured impulse responses of real or simulated transmission channels.

48. Apparatus adapted to perform the methods of any one of enumerated example embodiments 1-47.

49. Apparatus comprising means adapted to perform each step of the method of any one of enumerated example embodiments 1-47.

50. A computer program, stored on a computer-readable medium, for causing a computer to perform the methods of any one of enumerated example embodiments 1-47.

A number of example embodiments of the invention have been described in the specification. Nevertheless, it will be understood that various modifications may be made without departing from the spirit and scope of the invention. For example, some of the steps described herein may be order independent, and thus can be performed in an order different from that described.

We claim:

1. A method for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprising:

establishing, in response to the second audio signal and an audio input signal, a transfer function estimate of the electroacoustic channel, said transfer function estimate being adaptive in response to temporal variations in the transfer function of the electroacoustic channel, wherein the first audio signal is obtained on the basis of an additive combination of two signals, namely the audio input signal or a filtered version thereof, and a feedback signal, and wherein the establishing comprises:

filtering a signal obtained from the audio input signal by each of a plurality of parallel filters, wherein each filter from the plurality of parallel filters represents a transfer function from a group of transfer functions, and wherein the transfer functions of the group of transfer functions represent different physical variations in the electroacoustic channel;

subtractively combining the outputs of the plurality of parallel filters with a signal obtained from the second audio signal to obtain a plurality of error signals;

selecting one or a combination of transfer functions from said group of transfer functions based on the time-averaged mean-squared magnitude of the plurality of error signals; and deriving said transfer function estimate from said one or said combination of transfer functions selected from said group of transfer functions; and obtaining one or more filters whose transfer function is based on the transfer function estimate, and applying the first audio signal to the one or more filters.

2. A method according to claim 1 wherein the acoustic space also receives an audio disturbance signal and said feedback signal is derived from the difference between the second audio signal and an audio signal obtained by applying said first audio signal to the one or more filters based on the estimate of the transfer function of the electroacoustic channel, said difference being filtered by one or more further filters whose transfer function is an inverted version of the transfer function estimate.

3. A method according to claim 2 wherein the method includes actively cancelling noise, wherein the perceived audio response of the electroacoustic channel reduces or cancels the audio disturbance.

4. A method for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprising:

establishing, in response to the second audio signal and the first audio signal, a transfer function estimate of the electroacoustic channel, said transfer function estimate being adaptive in response to temporal variations in the transfer function of the electroacoustic channel, wherein the establishing comprises:

filtering a signal obtained from the first audio signal by each of a plurality of parallel filters, wherein each filter from the plurality of parallel filters represents a transfer function from a group of transfer functions, and wherein the transfer functions of the group of transfer functions represent different physical variations in the electroacoustic channel;

subtractively combining the outputs of the plurality of parallel filters with a signal obtained from the second audio signal to obtain a plurality of error signals;

selecting one or a combination of transfer functions from said group of transfer functions based on the time-averaged mean-squared magnitude of the plurality of error signals; and deriving said transfer function estimate from said one or said combination of transfer functions selected from said group of transfer functions; and obtaining one or more filters whose transfer function is an inverted version of the transfer function estimate and filtering with the one or more filters a target response filtered input signal to obtain the first audio signal.

5. A method according to claim 4, further comprising implementing said transfer function estimate with one or more of a plurality of time-invariant filters.

6. A method according to claim 4 wherein the transfer function estimate is adaptive in response to a time average of temporal variations in the transfer function of the electroacoustic channel.

7. A method according to claim 5 wherein said one or more of a plurality of time-invariant filters comprise:

one or more infinite impulse response (IIR) filters; or at least two filters in cascade, the first filter being an IIR filter and the second filter being a finite impulse response (FIR) filter.

8. A method according to claim 4 wherein:

said transfer function estimate from said one or said combination of transfer functions selected from the group of transfer functions is derived by employing an error minimization technique;

said transfer function estimate is established by cross fading from one to another of said one or said combination of said transfer functions selected from said group of transfer functions; or said transfer function estimate is established by selecting two or more of said transfer functions from said group of transfer functions and forming a weighted linear combination of them.

9. A method according to claim 4 wherein the characteristics of one or more transfer functions of the group of transfer functions includes the impulse responses of the electroacoustic channel across a range of variations in impulse responses with time.

10. A method according to claim 9 wherein the characteristics of said group of transfer functions are obtained according to an eigenvector method.

11. A method according to claim 4 wherein:

said first electromechanical transducer comprises at least one of a loudspeaker, an earspeaker, a headphone ear piece, or an ear bud; or said second electromechanical transducer comprises a microphone.

12. A method according to claim 4 wherein said acoustic space comprises a small acoustic space at least partially bounded by an over-the-ear or an around-the-ear cup, the degree to which the small acoustic space is enclosed being dependent on the closeness and centering of the ear cup with respect to the ear.

13. A method according to claim 12 wherein said variations in the transfer function of the electroacoustic channel result from changes in the location of the small acoustical space with respect to said ear.

14. A method according to claim 4 wherein each estimate of the transfer function of the electroacoustic channel comprises an estimate of the channel's magnitude response within a range of frequencies.

15. A method according to claim 4 wherein said first audio signal includes a speech and/or music audio signal.

16. An apparatus for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprising:

means for establishing, in response to the second audio signal and the first audio signal, a transfer function estimate of the electroacoustic channel, said transfer function estimate being adaptive in response to temporal variations in the transfer function of the electroacoustic channel, wherein the establishing comprising:

means for filtering a signal obtained from the first audio signal by each of a plurality of parallel filters, wherein each filter from the plurality of parallel filters represents a transfer function from a group of transfer functions, and wherein the transfer functions of the group of transfer functions represent different physical variations in the electroacoustic channel;

means for subtractively combining the outputs of the plurality of parallel filters with a signal obtained from the second audio signal to obtain a plurality of error signals;

means for selecting one or a combination of transfer functions from said group of transfer functions based on the time-averaged mean-squared magnitude of the plurality of error signals; and means for deriving said transfer function estimate from said one or said combination of transfer functions selected from said group of transfer functions; and means for obtaining one or more filters whose transfer function is an inverted version of the transfer function estimate and filtering with the one or more filters a target response filtered input signal to obtain the first audio signal.

17. A non-transitory computer readable storage medium product comprising encoded instructions which, when executing with one or more processors, controls the processors to perform process steps for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, the process steps comprising:

establishing, in response to the second audio signal and the first audio signal, a transfer function estimate of the electroacoustic channel, said transfer function estimate being adaptive in response to temporal variations in the transfer function of the electroacoustic channel, wherein the establishing comprising:

filtering a signal obtained from the first audio signal by each of a plurality of parallel filters, wherein each filter from the plurality of parallel filters represents a transfer function from a group of transfer functions, and wherein the transfer functions of the group of transfer functions represent different physical variations in the electroacoustic channel;

subtractively combining the outputs of the plurality of parallel filters with a signal obtained from the second audio signal to obtain a plurality of error signals;

selecting one or a combination of transfer functions from said group of transfer functions based on the time-averaged mean-squared magnitude of the plurality of error signals; and deriving said transfer function estimate from said one or said combination of transfer functions selected from said group of transfer functions; and obtaining one or more filters whose transfer function is an inverted version of the transfer function estimate and filtering with the one or more filters a target response filtered input signal to obtain the first audio signal.

18. A processor based system, for altering the soundfield in an electroacoustic channel in which a first audio signal is applied by a first electromechanical transducer to an acoustic space, causing changes in air pressure in the acoustic space, and a second audio signal is obtained by a second electromechanical transducer in response to changes in air pressure in the acoustic space, comprising:

an estimator, which functions in response to the second audio signal and the first audio signal, to establish a transfer function estimate of the electroacoustic channel, said transfer function estimate being adaptive in response to temporal variations in the transfer function of the electroacoustic channel, wherein the establishing comprising:

a plurality of parallel filters, for filtering a signal obtained from the first audio signal by each of the plurality of parallel filters, wherein each filter from the plurality of parallel filters represents a transfer function from a group of transfer functions, and wherein the transfer functions of the group of transfer functions represent different physical variations in the electroacoustic channel;

a subtractor, for subtractively combining the outputs of the plurality of parallel filters with a signal obtained from the second audio signal to obtain a plurality of error signals;

a selector, for selecting one or a combination of transfer functions from said group of transfer functions based on the time-averaged mean-squared magnitude of the plurality of error signals; and an estimator, for deriving said transfer function estimate from said one or said combination of transfer functions selected from said group of transfer functions; and a filter selector, for obtaining one or more filters whose transfer function is an inverted version of the transfer function estimate and filtering with the one or more filters a target response filtered input signal to obtain the first audio signal.

* * * * *